United States Patent
Richardson et al.

(10) Patent No.: US 8,261,155 B2
(45) Date of Patent: Sep. 4, 2012

(54) METHODS AND APPARATUS FOR ENCODING AND DECODING LOW DENSITY PARITY CHECK (LDPC) CODES

(75) Inventors: Thomas Richardson, South Orange, NJ (US); Naga Bhushan, San Diego, CA (US); Aamod Khandekar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1073 days.

(21) Appl. No.: 12/044,962

(22) Filed: Mar. 8, 2008

(65) Prior Publication Data

US 2008/0222486 A1    Sep. 11, 2008

Related U.S. Application Data

(60) Provisional application No. 60/894,183, filed on Mar. 9, 2007.

(51) Int. Cl.
*H03M 13/00* (2006.01)
(52) U.S. Cl. ........................................ 714/758; 714/752
(58) Field of Classification Search .................. 714/752, 714/758
See application file for complete search history.

(56) References Cited

U.S. PATENT DOCUMENTS

| | | | |
|---|---|---|---|
| 6,633,856 B2 | 10/2003 | Richardson et al. | |
| 6,957,375 B2 | 10/2005 | Richardson | |
| 6,961,888 B2 | 11/2005 | Jin et al. | |
| 7,133,853 B2 | 11/2006 | Richardson et al. | |
| 2005/0283707 A1* | 12/2005 | Sharon et al. | 714/758 |
| 2006/0031734 A1 | 2/2006 | Stolpman | |
| 2006/0156206 A1 | 7/2006 | Shen et al. | |
| 2007/0180345 A1* | 8/2007 | Ismail | 714/752 |

FOREIGN PATENT DOCUMENTS

| | | |
|---|---|---|
| JP | 2003115768 A | 4/2003 |
| JP | 2006519560 A | 8/2006 |
| JP | 2007503755 A | 2/2007 |
| WO | 2006016209 | 2/2006 |

OTHER PUBLICATIONS

International Search Report—PCT/US08/056390—International Search Authority, European Patent Office—Jul. 29, 2008.
Written Opinion—PCT/US08/056390—International Search Authority, European Patent Office—Jul. 29, 2008.
Stolpman V., et al., "Irregular Structured LDPC Codes," Internet Citation, [Online] XP002334838, Retrieved from the Internet: URL:http://www.ieee802.org/16/tge/contrib/C80216e-04_2640pdf [retrieved on Jul. 5, 2005] pp. 9-10.
Johnson, Sarah J., et al., "A Family of Irregular LDPC Codes With Low Encoding Complexity," IEEE Communications Letters, IEEE Service Center, Piscataway, NJ, US, vol. 7, No. 2, Feb. 1, 2003.
Taiwan Search Report—TW097108419—TIPO—Sep. 20, 2011.

* cited by examiner

*Primary Examiner* — Sam Rizk
(74) *Attorney, Agent, or Firm* — Sam Talpalatsky; Nicholas J. Pauley; Jonathan T. Velasco

(57) ABSTRACT

A novel apparatus and method for encoding data using a low density parity check (LDPC) code capable of representation by a bipartite graph are provided. To encode the data, an accumulate chain of a plurality of low degree variable nodes may be generated. The accumulate chain may then be closed to form a loop twice, once using a low degree variable nodes and once using a higher degree variable which is higher than the low degree variable node, where the higher degree variable node comprises a non-loop-closing edge. In one embodiment, the plurality of low degree variable nodes may have the same permutation on each edge.

41 Claims, 19 Drawing Sheets

$$H = \begin{bmatrix} 1 & 1 & 1 & 1 & 0 & 1 & 1 & 0 & 0 & 0 \\ 0 & 0 & 1 & 1 & 1 & 0 & 1 & 1 & 0 & 1 \\ 0 & 1 & 0 & 1 & 0 & 1 & 0 & 1 & 1 & 1 \\ 1 & 0 & 1 & 0 & 1 & 1 & 0 & 1 & 1 & 0 \\ 1 & 1 & 0 & 0 & 1 & 0 & 1 & 0 & 1 & 1 \end{bmatrix} \quad X = \begin{bmatrix} X_1 \\ X_2 \\ X_3 \\ X_4 \\ X_5 \\ X_6 \\ X_7 \\ X_8 \\ X_9 \\ X_{10} \end{bmatrix}$$

$$H' = \begin{bmatrix} 1 & 1 & 1 & 0 & 0 \\ 0 & 1 & 1 & 1 & 0 \\ 1 & 1 & 0 & 0 & 1 \\ \hline 1 & 0 & 0 & 1 & 1 \end{bmatrix} = \begin{bmatrix} A & B & T \\ C & D & E \end{bmatrix} \quad \text{501}$$

$$A = \begin{bmatrix} 1 \\ 0 \\ 1 \end{bmatrix} \quad \text{502} \qquad B = \begin{bmatrix} 1 \\ 1 \\ 1 \end{bmatrix} \quad \text{503} \qquad T = \begin{bmatrix} 1 & 0 & 0 \\ 1 & 1 & 0 \\ 0 & 0 & 1 \end{bmatrix} \quad \text{504}$$

$$C = [1] \quad \text{505} \qquad D = [0] \quad \text{506} \qquad E = [0 \quad 1 \quad 1] \quad \text{507}$$

$$\begin{bmatrix} A & B & T \\ -ET^{-1}A + C & -ET^{-1}B + D & 0 \end{bmatrix} = \begin{bmatrix} 1 & 1 & 1 & 0 & 0 \\ 0 & 1 & 1 & 1 & 0 \\ 1 & 1 & 0 & 0 & 1 \\ \hline 1 & 1 & 0 & 0 & 0 \end{bmatrix} \quad \text{508}$$

$$\phi = -ET^{-1}B + D = [1] \quad \text{509} \qquad \phi^{-1} = [1] \quad \text{510}$$

$As = \begin{bmatrix} 1 \\ 0 \\ 1 \end{bmatrix}$    602

$T^{-1}As = \begin{bmatrix} 1 \\ 1 \\ 1 \end{bmatrix}$    603

$ET^{-1}As = [0]$    604

$ET^{-1}As + Cs = [1]$    605

$p_1 = \phi^{-1}(ET^{-1}As + Cs) = [1]$    606

$Bp_1 = \begin{bmatrix} 1 \\ 1 \\ 1 \end{bmatrix}$    607

$Bp_1 + As = \begin{bmatrix} 0 \\ 1 \\ 0 \end{bmatrix}$    608

$p_2 = T^{-1}(Bp_1 + As) = \begin{bmatrix} 0 \\ 1 \\ 0 \end{bmatrix}$    609

$x = \begin{bmatrix} 1 \\ 1 \\ 0 \\ 1 \\ 0 \end{bmatrix}$    610

Figure 6

$$H = \left[\begin{array}{ccc|ccc|ccc|ccc|ccc} 0 & 1 & 0 & 0 & 1 & 0 & 0 & 0 & 1 & 0 & 0 & 0 & 0 & 0 & 0 \\ 0 & 0 & 1 & 0 & 0 & 1 & 1 & 0 & 0 & 0 & 0 & 0 & 0 & 0 & 0 \\ 1 & 0 & 0 & 1 & 0 & 0 & 0 & 1 & 0 & 0 & 0 & 0 & 0 & 0 & 0 \\ \hline 0 & 0 & 1 & 0 & 0 & 0 & 0 & 0 & 0 & 1 & 0 & 0 & 1 & 0 & 0 \\ 1 & 0 & 0 & 0 & 0 & 0 & 0 & 0 & 0 & 0 & 1 & 0 & 0 & 1 & 0 \\ 0 & 1 & 0 & 0 & 0 & 0 & 0 & 0 & 0 & 0 & 0 & 1 & 0 & 0 & 1 \\ \hline 1 & 0 & 0 & 0 & 0 & 1 & 0 & 0 & 0 & 0 & 0 & 0 & 0 & 1 & 0 \\ 0 & 1 & 0 & 1 & 0 & 0 & 0 & 0 & 0 & 0 & 0 & 0 & 0 & 0 & 1 \\ 0 & 0 & 1 & 0 & 1 & 0 & 0 & 0 & 0 & 0 & 0 & 0 & 1 & 0 & 0 \\ \hline 0 & 0 & 0 & 1 & 0 & 0 & 0 & 1 & 0 & 0 & 0 & 1 & 0 & 0 & 0 \\ 0 & 0 & 0 & 0 & 1 & 0 & 0 & 0 & 1 & 1 & 0 & 0 & 0 & 0 & 0 \\ 0 & 0 & 0 & 0 & 0 & 1 & 1 & 0 & 0 & 0 & 1 & 0 & 0 & 0 & 0 \end{array}\right] = \begin{bmatrix} \sigma^1 & \sigma^1 & \sigma^2 & 0 & 0 \\ \sigma^2 & 0 & 0 & \sigma^0 & \sigma^0 \\ \sigma^0 & \sigma^1 & 0 & 0 & \sigma^2 \\ 0 & \sigma^0 & \sigma^1 & \sigma^2 & 0 \end{bmatrix}$$

| | $x_{,1}$ | | | $x_{,2}$ | | | $x_{,3}$ | | | $x_{,4}$ | | | $x_{,5}$ | | |
|---|---|---|---|---|---|---|---|---|---|---|---|---|---|---|---|
| $x_{1,}$ | 1,1 | 1,2 | 1,3 | 1,4 | 1,5 | 1,6 | 1,7 | 1,8 | 1,9 | 1,10 | 1,11 | 1,12 |
| $x_{2,}$ | 2,1 | 2,2 | 2,3 | 2,4 | 2,5 | 2,6 | 2,7 | 2,8 | 2,9 | 2,10 | 2,11 | 2,12 |
| $x_{3,}$ | 3,1 | 3,2 | 3,3 | 3,4 | 3,5 | 3,6 | 3,7 | 3,8 | 3,9 | 3,10 | 3,11 | 3,12 |

← 1202'
← 1202''
← 1202'''

| | $c_{,1}$ | | | $c_{,2}$ | | | $c_{,3}$ | | | $c_{,4}$ | | |
|---|---|---|---|---|---|---|---|---|---|---|---|---|
| $c_{1,}$ | 2,1 | 2,4 | 3,7 | 3,2 | 1,9 | 1,11 | 1,3 | 3,5 | 2,12 | 1,6 | 2,8 | 3,10 |
| $c_{2,}$ | 3,1 | 3,4 | 1,7 | 1,2 | 2,9 | 2,11 | 2,3 | 1,5 | 3,12 | 2,6 | 3,8 | 1,10 |
| $c_{3,}$ | 1,1 | 1,4 | 2,7 | 2,2 | 3,9 | 3,11 | 3,3 | 2,5 | 1,12 | 3,6 | 1,8 | 2,10 |

$$H' = \begin{bmatrix} \sigma^1 & \sigma^1 & \sigma^2 & 0 & 0 \\ 0 & \sigma^0 & \sigma^1 & \sigma^2 & 0 \\ \sigma^0 & \sigma^1 & 0 & 0 & \sigma^2 \\ \sigma^2 & 0 & 0 & \sigma^0 & \sigma^0 \end{bmatrix}$$

1302

$$A = \begin{bmatrix} \sigma^1 \\ 0 \\ \sigma^0 \end{bmatrix}$$

1303

$$B = \begin{bmatrix} \sigma^1 \\ \sigma^0 \\ \sigma^1 \end{bmatrix}$$

1304

$$T = \begin{bmatrix} \sigma^2 & 0 & 0 \\ \sigma^1 & \sigma^2 & 0 \\ 0 & 0 & \sigma^2 \end{bmatrix}$$

1305

$$C = \begin{bmatrix} \sigma^2 \end{bmatrix}$$

1306

$$D = \begin{bmatrix} 0 \end{bmatrix}$$

1307

$$E = \begin{bmatrix} 0 & \sigma^0 & \sigma^0 \end{bmatrix}$$

1308

$$\begin{bmatrix} A & B & T \\ -ET^{-1}A + C & -ET^{-1}B + D & 0 \end{bmatrix} = \begin{bmatrix} \sigma^1 & \sigma^1 & \sigma^2 & 0 & 0 \\ 0 & \sigma^0 & \sigma^1 & \sigma^2 & 0 \\ \sigma^0 & \sigma^1 & 0 & 0 & \sigma^2 \\ \sigma^2 & \sigma^2 & 0 & 0 & 0 \end{bmatrix}$$

1309

$$\phi = \begin{bmatrix} \sigma^2 \end{bmatrix}$$

1310

$$\phi^{-1} = \begin{bmatrix} \sigma^1 \end{bmatrix}$$

Figure 13

METHODS AND APPARATUS FOR ENCODING AND DECODING LOW DENSITY PARITY CHECK (LDPC) CODES

CLAIM OF PRIORITY UNDER 35 U.S.C. §119

The present application for patent claims priority to U.S. Provisional Application No. 60/894,183 entitled "Methods and Apparatus for Encoding and Decoding LDPC Codes" filed Mar. 9, 2007, and assigned to the assignee hereof and hereby expressly incorporated by reference herein.

BACKGROUND

1. Field

The present application is directed to methods and apparatus for encoding and decoding data for the purpose of detecting and/or correcting errors in binary data, e.g., through the use of parity check codes, such as low density parity check (LDPC) codes.

2. Background

Error correcting codes are ubiquitous in communications and data storage systems. Recently, considerable interest has grown in a class of codes known as low-density parity-check (LDPC) codes.

LDPC codes are often represented by bipartite graphs, called Tanner graphs, in which one set of nodes, the variable nodes, correspond to bits of a codeword and the other set of nodes, the constraint nodes, sometimes called check nodes, correspond to a set of parity-check constraints which define the code. Edges in the graph connect variable nodes to constraint nodes. A variable node and a constraint node are said to be neighbors if they are connected by an edge in the graph. For simplicity, it is generally assumed that a pair of nodes is connected by at most one edge.

A bit sequence associated one-to-one with the variable nodes is a codeword of the code if and only if, for each constraint node, the bits neighboring the constraint (via their association with variable nodes) sum to zero modulo two, i.e., they comprise an even number of ones.

In some cases a codeword may be punctured. This refers to the act of removing or puncturing certain bits from the codeword and not actually transmitting them. When encoding an LDPC code, however, bits which are to be punctured are still determined. Thus, puncturing has little or no impact on the encoding process. For this reason, the possibility of puncturing will not be considered in the remainder of this application.

The decoders and decoding algorithms used to decode LDPC codewords operate by exchanging messages within the graph along the edges and updating these messages by performing computations at the nodes based on the incoming messages. Such algorithms are generally referred to as message passing algorithms. Each variable node in the graph is initially provided with a soft bit, termed a received value that indicates an estimate of the associated bit's value as determined by observations from, e.g., the communications channel. The encoding process also operates in part along the edges of the graph but the connection is less precise.

The number of edges attached to a node, i.e., a variable node or constraint node, is referred to as the degree of the node. A regular graph or code is one for which all variable nodes have the same degree, j, and all constraint nodes have the same degree, k. In this case, the code is a (j,k) regular code. These codes were originally invented by Gallager (1961). In contrast to a "regular" code, an irregular code has constraint nodes and/or variable nodes of differing degrees. For example, some variable nodes may be of degree 4, others of degree 3 and still others of degree 2.

While irregular codes can be more complicated to represent and/or implement, it has been shown that irregular LDPC codes can provide superior error correction/detection performance when compared to regular LDPC codes.

While encoding efficiency and high data rates are important for an encoding and/or decoding system to be practical for use in a wide range of devices, e.g., consumer devices, it is important that the encoders and/or decoders be capable of being implemented at reasonable cost. Accordingly, there is a need to efficiently implement encoding/decoding schemes used for error correction and/or detection purposes, e.g., in terms of hardware costs.

SUMMARY

One feature provides an apparatus and method for encoding data. In particular, a method is provided for encoding data using a low density parity check (LDPC) code capable of representation by a bipartite graph. To encode the data, an accumulate chain of a plurality of low degree variable nodes may be generated. The accumulate chain may then be closed to form a loop twice, once using a low degree variable nodes and once using a higher degree variable which is higher than the low degree variable node, where the higher degree variable node comprises a non-loop-closing edge. In one embodiment, the plurality of low degree variable nodes may have the same permutation on each edge.

In the method, the plurality of low degree variable nodes may comprise a plurality of core degree two variable nodes, the higher degree variable node may comprise a core degree three variable node and the loop-closing low degree variable node may comprises a loop-closing core degree two variable node.

The method may further comprise: using a lifted graph comprising a plurality of permuted copies of the accumulate chain, a plurality of permuted copies of the loop-closing low degree variable node and a plurality of permuted copies of the loop-closing higher degree variable node.

The method may further comprise: using a cyclic lifted low density parity check (LDPC) code in which for some base variable nodes, half of the lifted variable nodes may be information nodes and half may be parity nodes.

The method may further comprise: using a non-loop-closing edge permutation on a non-loop-closing edge of a core degree three encoding node, wherein the non-loop-closing edge permutation may be zero; and using for all other permutations, on the edges of core degree two variable nodes participating in the loop, the values zero or negative one mod $2^n$.

Similarly, an apparatus is provided comprising a communication interface and a processor. The communication interface may be configured to receive and transmit data. The processor may be configured to (a) generate an accumulate chain of a plurality of low degree variable nodes and (b) close the accumulate chain to form a loop twice, once using a low degree variable nodes and once using a higher degree variable which is higher than the low degree variable node, where the higher degree variable node comprises a non-loop-closing edge.

The apparatus may further comprise: using a lifted graph comprising a plurality of permuted copies of the accumulate chain, a plurality of permuted copies of the loop-closing low degree variable node and a plurality of permuted copies of the loop-closing higher degree variable node.

The apparatus may further comprise: using a cyclic lifted low density parity check (LDPC) code in which for some base variable nodes, half of the lifted variable nodes may be information nodes and half may be parity nodes.

The apparatus may further comprise: using a non-loop-closing edge permutation on a non-loop-closing edge of a core degree three encoding node, wherein the non-loop-closing edge permutation may be zero; and using for all other permutations, on the edges of core degree two variable nodes participating in the loop, the values zero or negative one mod $2^n$.

Consequently, an apparatus is provided comprising (a) means for generating an accumulate chain of a plurality of low degree variable nodes and (b) means for closing the accumulate chain to form a loop twice, once using a low degree variable nodes and once using a higher degree variable which is higher than the low degree variable node, where the higher degree variable node comprises a non-loop-closing edge.

The apparatus may further comprise: means for using a lifted graph comprising a plurality of permuted copies of the accumulate chain, a plurality of permuted copies of the loop-closing low degree variable node and a plurality of permuted copies of the loop-closing higher degree variable node.

The apparatus may further comprise: means for using a cyclic lifted low density parity check (LDPC) code in which for some base variable nodes, half of the lifted variable nodes may be information nodes and half may be parity nodes.

The apparatus may further comprise: means for using a non-loop-closing edge permutation on a non-loop-closing edge of a core degree three encoding node, wherein the non-loop-closing edge permutation may be zero; and using for all other permutations, on the edges of core degree two variable nodes participating in the loop, the values zero or negative one mod $2^n$.

Similarly, a processor readable medium is provided having one or more instructions operational on an encoder, for achieving encoding data using a low density parity check (LDPC) code capable of representation by a bipartite graph, which when executed by a processor causes the processor to (a) generate an accumulate chain of a plurality of low degree variable nodes and (b) close the accumulate chain to form a loop twice, once using a low degree variable nodes and once using a higher degree variable which is higher than the low degree variable node, where the higher degree variable node comprises a non-loop-closing edge.

Similarly, a processor is provided having a processing circuit configured to perform functions to achieve (a) generating an accumulate chain of a plurality of low degree variable nodes; and (b) closing the accumulate chain to form a loop twice, once using a low degree variable nodes and once using a higher degree variable which is higher than the low degree variable node, where the higher degree variable node comprises a non-loop-closing edge.

BRIEF DESCRIPTION OF THE DRAWINGS

The features, nature, and advantages of the present features may become more apparent from the detailed description set forth below when taken in conjunction with the drawings in which like reference characters identify correspondingly throughout.

FIG. 2 is a matrix representation of the code graphically illustrated in FIG. 1.

FIG. 5 illustrates an example of pre-preprocessing for encoding the LDPC code illustrated in FIG. 3.

FIG. 6 illustrates a process for encoding an information block using pre-computed matrices.

FIG. 11 illustrates the effect of replacing the 3×3 identity matrices shown in FIG. 9 with cyclic permutation matrices.

FIG. 12 illustrates how the edges in the code shown in FIG. 11 can be enumerated in order from the variable node side, and how the same edges will appear from the constraint node side after being subject to a cyclic permutation.

FIG. 13 illustrates a possible pre-processing step for encoding the LDPC code illustrated in FIG. 11.

DETAILED DESCRIPTION

Figure 1:
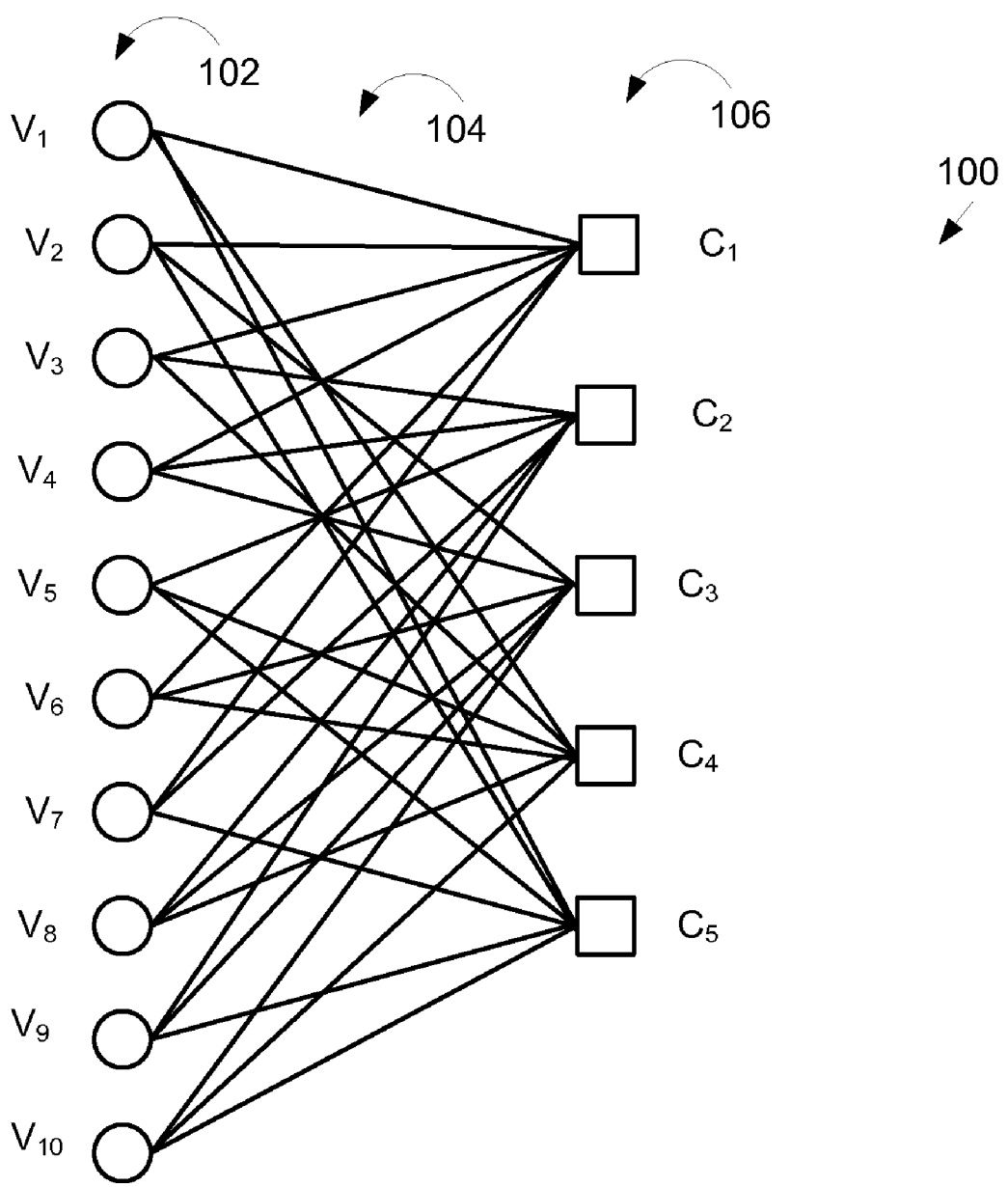
FIG. 1 illustrates a small bipartite graph representation of a regular LDPC code of length ten.

In the following description, specific details are given to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, structures and techniques may be shown in detail in order not to obscure the embodiments.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

LDPC Codes

FIG. 1 illustrates an example of a bipartite graph 100 determining a (3, 6) regular LDPC code of length ten and rate one-half. Length ten indicates that there are ten variable nodes V1-V10 102, each identified with one bit of the codeword X1-X10. Rate one half indicates that there are half as many check nodes as variable nodes, i.e., there are five check nodes C1-C5 106. Rate one half may further indicate that the five constraints are linearly independent, as discussed below.

While FIG. 1 illustrates a graph associated with a code of length 10, it may be appreciated that representing the graph for a codeword of length 1000 would be 100 times more complicated.

FIG. 2 illustrates a parity check matrix representation, which may be an alternative to the Tanner graph (or bipartite graph) representation, of the LDPC code shown in FIG. 1. A parity check matrix consists of a set of linear constraints on the transmitted bits. In this representation of a code, a matrix H 202, commonly referred to as the parity check matrix, may include the relevant edge connection, variable node and constraint node information. In the matrix H 202, each column may correspond to one of the variable nodes while each row may correspond to one of the constraint nodes. Since there are 10 variable nodes and 5 constraint nodes in the example code, the matrix H includes 10 columns and 5 rows. The entry of the matrix corresponding to a particular variable node and a particular constraint node may be set to 1 if an edge is present in the graph, i.e., if the two nodes are neighbors, otherwise it may be set to 0. For example, since variable node V1 is connected to constraint node $C_1$ by an edge, a one is located in the uppermost lefthand corner of the matrix H 202. However, variable node $V_5$ is not connected to constraint node $C_1$ so a 0 is positioned in the fifth position of the first row of the matrix H 202 indicating that the corresponding variable and constraint nodes are not connected. The constraints may be linearly independent if the rows of the matrix H 202 are linearly independent vectors over GF[2] (a Galois field of order 2).

In the case of a matrix representation, the codeword X, which is to be transmitted, may be represented as a vector 206 which includes the bits X1-Xn of the codeword to be processed. A bit sequence X1-Xn may be a codeword if and only if the product of the matrix 206 and 202 is equal to zero, that is: Hx=0.

Encoding LDPC Codes

The encoding process for an LDPC code may be a mapping from input information bits to an LDPC codeword. There may be many possible forms this mapping may take.

A general purpose approach to encoding LDPC codes is described in detail in a paper by Thomas J. Richardson and Ruediger L. Urbanke, titled "Efficient Encoding of Low Density Parity Check Codes" printed in the IEEE Trans. on Information Theory, pp. 638-656, Vol. 47, Number 2, February 2001.

The encoding process of the present application may be utilized with a general purpose encoding device enabling fast parallel encoding of the class of LDPC codes which may be supported by the decoder disclosed in U.S. patent application Ser. No. 09/975,331 (now U.S. Pat. No. 6,633,856). In the '856 patent, a certain structured class of LDPC codes was considered and a decoder architecture proposed for them. In the present application, certain features of the decoder architecture may reappear as part of an encoder structure.

In the encoding process of the present application, an m×n parity check matrix may have m<n and rank m, that is, the rows may be linearly independent. When m>n, redundant rows may be removed without changing the code.

First, certain operations which are part of the process of designing an encoder will be described. The pre-processing computation described below may be performed in software as part of code design and may not be part of the actual implementation of the encoder.

The first step in the design of an encoder may be to rearrange rows and columns to put the matrix H in approximate lower triangular form.

$$H = \begin{bmatrix} A & B & T \\ C & D & E \end{bmatrix}$$

where A is (m−g)×(n−m), B is (m−g)×g, T is (m−g)×(m−g), g×(n−m), D is g×g, and E is g×(m−g). The matrix T may be lower triangular with all diagonal entries equal to 1. Multiplying matrix H from the left by $$\begin{bmatrix} I & 0 \\ ET^{-1} & I \end{bmatrix}$$

results in $$\begin{bmatrix} A & B & T \\ -ET^{-1}A+C & -ET^{-1}B+D & 0 \end{bmatrix}$$

Next, $\phi$ may be defined as $\phi=(-ET^{-1}B+D)$ and non-singular. The matrix $\phi^{-1}$ may then be computed and saved. In the case where $\phi$ may not be invertible, the row of H may be considered linearly independent and the columns may be permuted inside the submatrix $$\begin{bmatrix} A & B \\ C & D \end{bmatrix}$$

to ensure that $\phi$ is invertible. If the rows of H are not linearly independent, then some of the rows of H may be removed so that the remaining rows may be linearly independent without changing the definition of the code. It should be noted that all of the above computation may be independent of the data to be encoded and may not be part of the encoding process. These steps may be normally performed once as part of encoder design and may or may not be repeated during encoder use.

Encoding Data into a Codeword

A codeword may be denoted as x=(s,p1,p2), where s may denote the systematic part, p1 and p2 combined may denote the parity part, p1 may have a length g and p2 may have a length (m−g). The encoding problem is to find p1 and p2 given s. The defining equation $Hx^T=0^T$ may be split naturally into the following two equations:

$$As^T+Bp_1^T+Tp_2^T=0$$

$$(-ET^{-1}A+C)s^T+(-ET^{-1}B+D)p_1^T=0$$

From the above equation it may be concluded that $p_1^T=-\phi^{-1}(-ET^{-1}A+C)s^T$. $(-ET^{-1}A+C)s^T$ may be computed efficiently since all matrices are sparse and given $As^T$, $T^{-1}As^T$ may be found efficiently by solving $Tz=As^T$ for using z back substitution. The matrix $\phi^{-1}$ may be dense in general but g may be made small by design and this matrix may be pre-computed. Thus, $p_1^T$ may be obtained efficiently. Now, $p_2^T$ may be easily and efficiently determined by solving $Tp_2^T=-As^T-Bp_1^T$. (See FIGS. 6 and 7)

The above description provides a method for encoding any LDPC code. It will be appreciated that many constructions of LDPC codes may give rise to other natural encoding mechanisms, e.g. RA codes.

The present application provides a parallelized encoder that may use encoding methods for binary codes, such as described above, and "lift" them along with the parity check matrices into a parallel encoding engine for the "vectorized" LDPC codes. Lifting is a technique to generate a large LDPC code from several copies of a small "base code" which is a small parity check matrix, say of size $(n_0,k_0)$. It may enable implementation of parallel encoding and decoding algorithms as well as reduce description complexity for the large code.

In U.S. patent application Ser. No. 09/975,331 titled "Methods and Apparatus for Decoding LDPC Codes", now U.S. Pat. No. 6,633,856 issued on Oct. 14, 2003, a structured "vectorized" class of LDPC graphs is described and motivated. In the '856 patent, the motivation was to provide for a highly efficient decoder architecture. The present application is directed to a corresponding architecture that may be suitable for encoding the same class of codes as in the '856 patent. However the present application, unlike the '856 patent, may include encoding operations that may be performed efficiently and in parallel and so that the architecture may allow the specification of the particular LDPC code to be programmable.

Small LDPC Graph

Figures 3, 4:
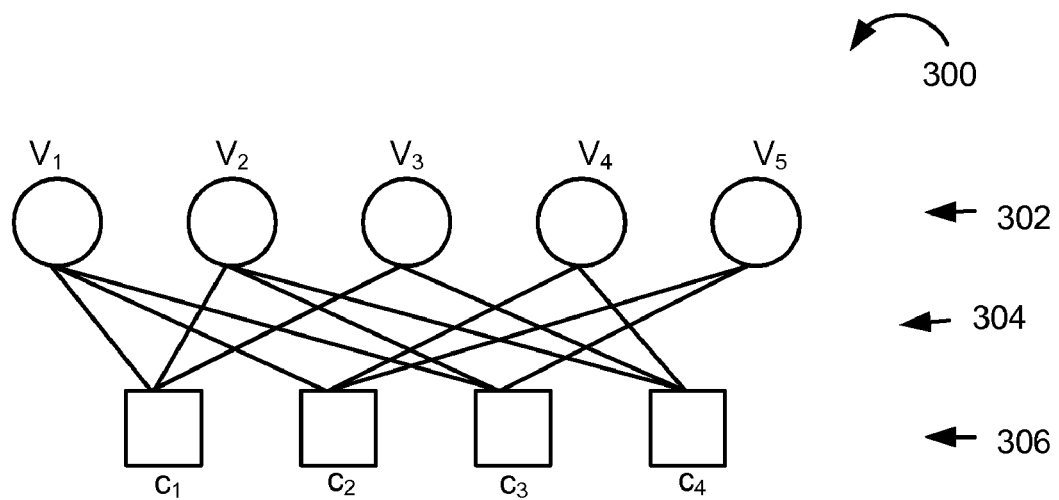
FIG. 3 is a graphical representation of a small LDPC code.
FIG. 4 illustrates a parity check matrix representation of the small LDPC code graphically illustrated in FIG. 3.

FIG. 3 illustrates a graph 300 of a simple irregular LDPC. The code may be of length five as indicated by the 5 variable nodes V1 through V5 302. Four check nodes C1 through C4 306 may be coupled to the variable nodes 302 by a total of 12 edges 304.

FIG. 4 illustrates the LDPC code shown in FIG. 3 in a parity check matrix form using matrices 402, 404. Edges may be represented in the permutation matrix H 402 using 1's. Bit xi may be associated with variable node Vi.

FIGS. 5 and 6 illustrate the encoding process for the LDPC code shown in FIG. 3. As described above, the encoding pre-processing step may include rearranging the rows and columns of the parity check matrix H 404, shown in FIG. 4, into a lower triangular form. FIG. 5 illustrates an example of rearrangement of the matrix of FIG. 4. The matrix may be rearranged by swapping row 2 and row 4.

In FIG. 5, matrix H 501 shows the different components after rearrangement. For purpose of annotation, a sub-matrix (r1, r2; c1, c2) may be defined to be the matrix comprising all the entries with row index in [r1, r2] and column index in [c1, c2] in the original matrix. Matrix A 502 may be defined as the sub-matrix (1, 3; 1, 1) of matrix H 501. Matrix B 503 may be defined as the sub-matrix (1, 3; 2, 2) of matrix H. Matrix T 504 may be defined as the sub-matrix (1, 3; 3, 5) of matrix H, which is of lower triangular form. Matrix C 505 may be defined as the sub-matrix (4, 4; 1, 1) of matrix H. Matrix D 506 may be defined as the sub-matrix (4, 4; 2, 2) of matrix H. Matrix E 507 may be defined as the sub-matrix (4, 4; 3, 5) of matrix H. The derivation of $\phi=(-ET^{-1}B+D)$, by Gaussian elimination, is illustrated in 508 where $\phi$ 509 and its inverse $\phi^{-1}$ 510 may be obtained.

FIG. 6 illustrates the actual encoding process given information block s=[1] 601 and the pre-computed matrices shown in FIG. 5. Standard multiplication of a vector by a matrix may allow computation of As 602, $T^{-1}$As 603, $ET^{-1}$As 604, $ET^{-1}$As+Cs 605, $p_1=\phi^{-1}(ET^{-1}$As+Cs) 606, $Bp_1$ 607, $Bp_1$+As 608, and $p_2=T^{-1}(Bp_1$+As) 609. It should be noted that multiplication by $T^{-1}$ may be performed using back substitution. In the final result, the coded bits x=[$p_1,p_2,s$] may be shown in vector 610.

Multiplication of a binary vector by a binary matrix may be decomposed into a sequence of simple operations. For example, consider multiplying a binary matrix U (m×n) with a binary vector v (n×1) in a hardware processor. It may be assumed that prior to multiplication, the vector v may be available at some physical location, e.g. memory, starting at index s, and the result may be stored at a location starting at index t. Furthermore, it may be assumed that row i,i∈[0,m−1] of matrix U has nonzero entries, i.e. 1's at columns indexed as $l_{i,1}, l_{i,2}, \ldots, l_{i,k_i}$. Two instructions (1) (0 a b) and (2) (1 a b) may be defined as follows: (0 a b) may instruct the processor to read out the value at location b and write it to location a; (1 a b) may instruct to read out the value at location b and add it to, i.e. x-or with the current value at, location a. In other words, the second operation may accumulate the value at location a; the first, overwrites. Now, the multiplication of vector v by U may be decomposed into the following sequence of those two simple operations: $(0 \ t \ s+l_{0,1}), (1 \ t \ s+l_{0,2}), \ldots, (1 \ t \ s+l_{0,5_0}); (0 \ t+1 \ s+l_{1,1}), (1 \ t+1 \ s+l_{1,2}), \ldots, (1 \ t+1 \ s+l_{1,k_1}); \ldots; (0 \ t+m-1 \ s+l_{n-1,1}), (1 \ t+m-1 \ s+l_{n-1,2}), \ldots, (1 \ t+m-1 \ s+l_{n-1,k_{n-1}})$. The total number of instructions may be the same as the number of non-zero entries in the matrix.

Figure 7:
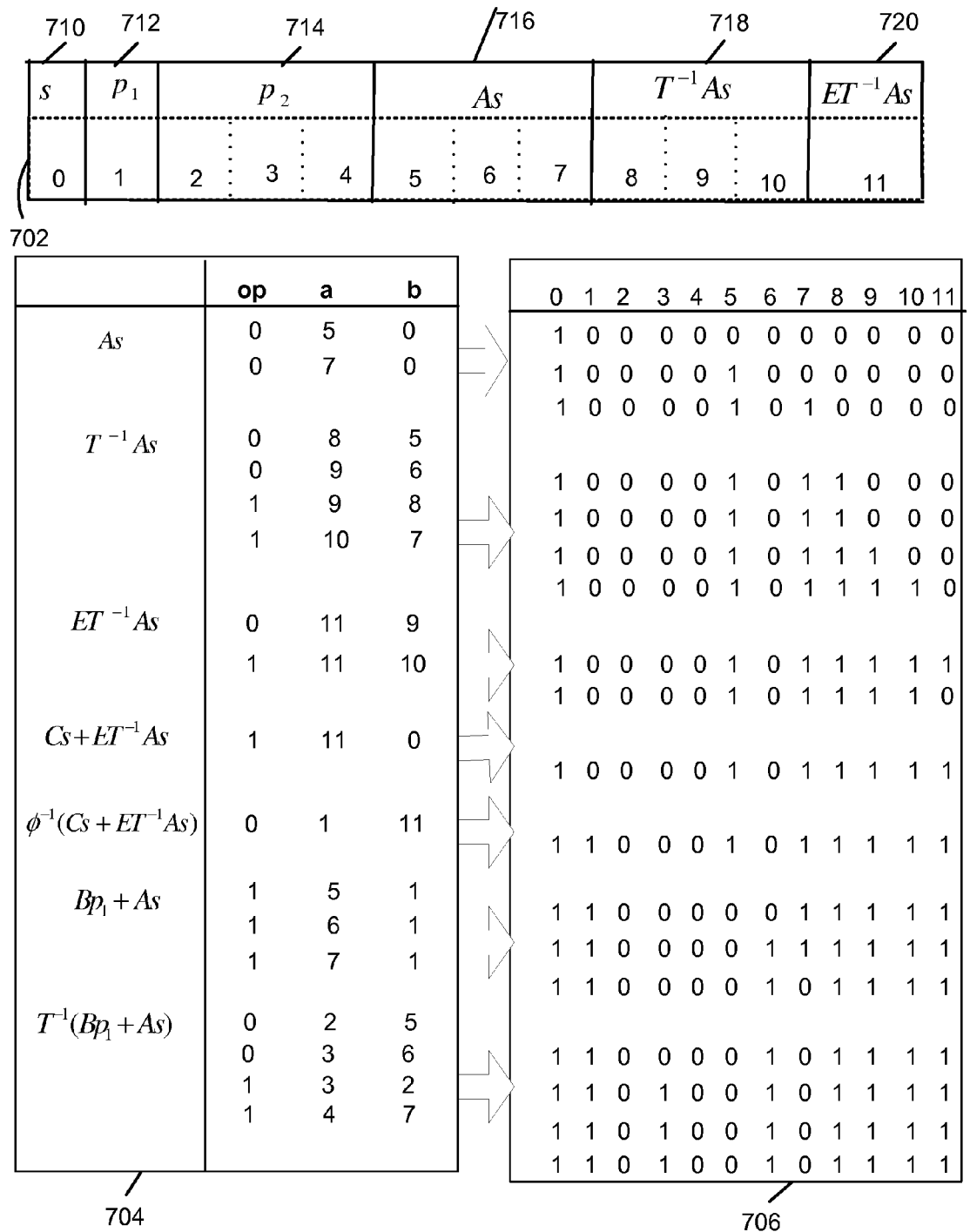
FIG. 7 illustrates an encoding process as a sequence of two simple instructions/operations corresponding to the LDPC code shown in FIG. 3.

FIG. 7 illustrates the encoding process as a sequence of the two simple instructions/operations corresponding to the LDPC code shown in FIG. 3. A memory device 702 may store information bits, coded bits, and intermediate variables. The location 0 of the memory 702 may be assigned to store the single information bit s 710; location 1 may be assigned to store parity bit $p_1$ 712; locations 2 to 4 may be assigned to store parity bits $p_2$ 714. Additional memory space may be provided to hold intermediate values. The example memory 902 may provide locations 5 to 7 to store the value of As 716 and later that of $Bp_1+As$; it may provide locations 8 to 10 to store $T^{-1}As$ 718; and it may provide location 11 to store $ET^{-1}As$ 720.

With respect to the above allocation of memory 702, the encoding process illustrated in FIG. 6 as matrix multiplication with vectors may be decomposed into a sequence of operations (0 a b) and (1 a b) listed in Table 704. For clarity, Table 704 shows the sequence of instructions, one per row, together with their respective matrix multiplication counterparts. For example, multiplication As may be decomposed to two instructions: (0 5 0) followed by (0 7 0). Table 706 shows the contents of memory locations 0 through 11 at the time an instruction shown in the corresponding row on table 704 may be executed. The result of executing the instruction on Table 704 may be shown in the next row of Table 706. For example, the same information bits may be encoded as in FIG. 5 by storing s=[1] into location 0, as illustrated in the first row of Table 706. Operations executing instruction (0 5 0) followed by instruction (0 7 0) may give the result As=(1 0 1) in locations from 5 to 7, as shown in row three of block 706. This may be the same result as its counterpart in FIG. 5. Table 706 illustrates the complete encoding process in terms of the content of memory locations 0 through 11 as the sequence of elementary instructions in Table 704 is executed.

The sequence instructions of Table 704 may be readily translated into a hardware implementation. Straightforward modifications may be made during a hardware implementation, e.g., to comply with the memory operation constraints of the utilized hardware.

General LDPC Encoder

Figure 8:
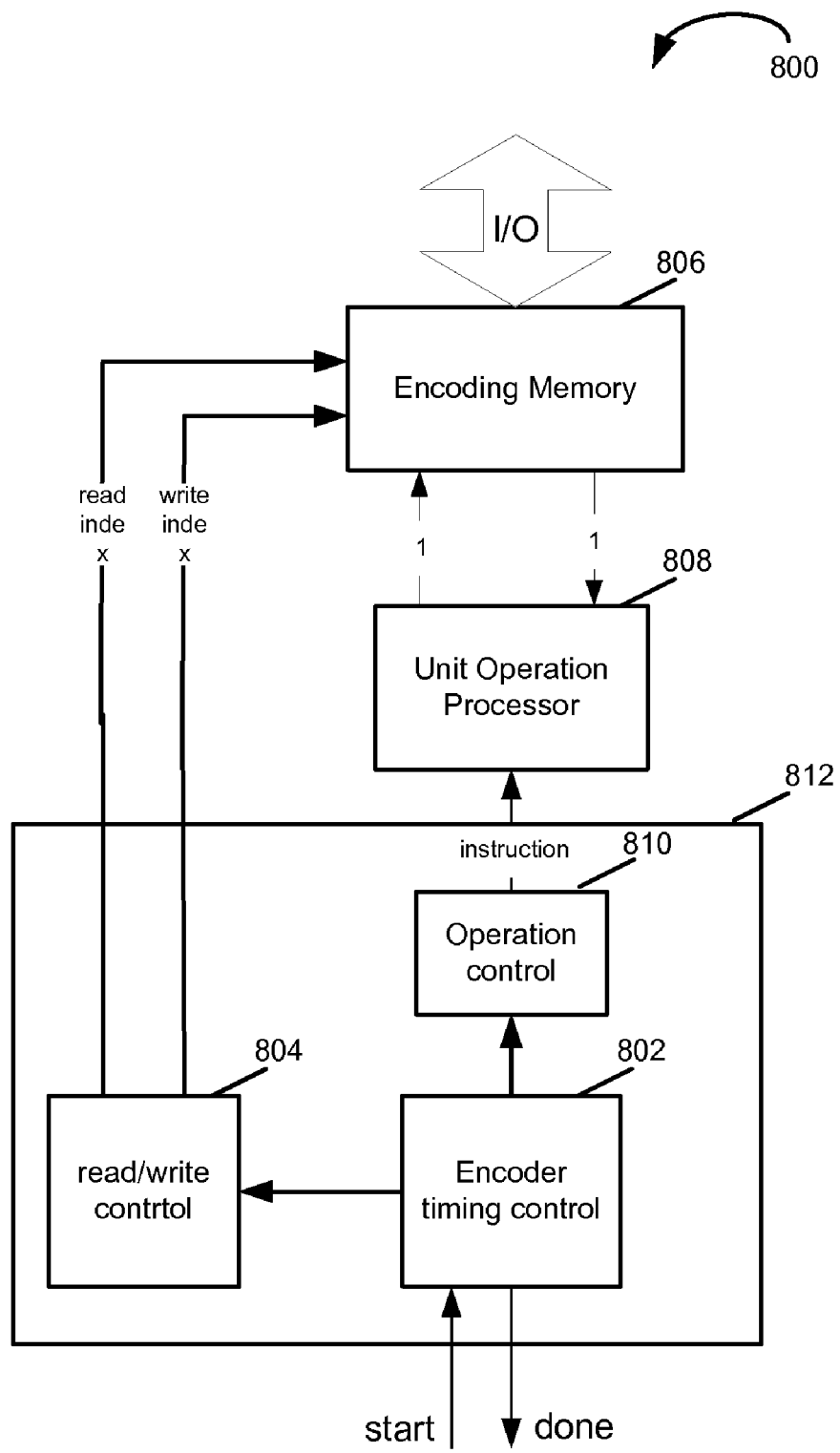
FIG. 8 illustrates a general LDPC encoder.

FIG. 8 illustrates a general LDPC encoder 800. A unit operation processor 808 may perform one of three possible operations indicated by a received instruction. The unit operation processor 808 may either clear a sum bit, xor a sum bit with a bit read from memory or output a sum bit to an encoding memory 806. Operations to be performed may be selected by operation on an operation control module 810, in an encoder control module 800, and specified to the unit operation processor 808 in the form of one or more instructions. A read/write control module 804, the encoder control module 800, may specify the order in which the encoding memory 806 is accessed. Timing of the form of both the operation control module 810 and the read/write control module 806 may be controlled by an encoder timing control module 802, in the encoder control module 800, which determines the data flow of the encoder through the timing control signal. The encoding memory 806 may be a dual port memory block which can be written into or read from independently using a SIMD read or write instruction.

Vectorization of Encoding Process

Given a vectorized LDPC graph, the encoding process of the present application may be vectorized as follows. The encoder may operate as if it were encoding Z copies of the projected LDPC code synchronously and in parallel. Control of the encoding process may correspond to the projected LDPC graph and may be shared across the Z copies. Thus, the encoder may be described as operating on bit vectors, each vector having Z elements. One deviation from purely disjoint parallel encoding of the Z projected graphs may be that bits are reordered within a bit vector during the encoding process. This reordering operation may be referred to as a rotation. The rotation may implement the permutation operations defined by Ψ, where Ψ may represent a group that defines the permutations. Because of the rotations, the processing paths of the Z copies of the projected graph may mix, thereby linking them to form a single large graph. Control information which specifies the rotations may be obtained in addition to the control information for the projected graph. Fortunately, the rotation control information may be specified using relatively little memory.

While various permutations may be used for the rotations, the use of cyclic permutations is particularly interesting because of the ease with which such permutations may be implemented. For simplicity it may be assumed that Ψ comprises the group of cyclic permutations. In this case, the large LDPC graphs may be constrained to have a quasi-cyclic structure. For purposes of this example, N may be the number of variable nodes in the graph and M may be the number of constraint nodes in the graph. It may be assumed that both N and M are multiples of Z, N=nZ and M=mZ where Z may denote the order of the cycle.

Nodes may be identified through the use of a double index. Thus, variable node $v_{i,j}$ may be the jth variable node from the ith copy of the projected graph. Since Ψ is the group of cyclic permutations, variable node $v_{i,j}$ may be connected to a constraint node $c_{a,b}$ if and only if variable node $v_{i+k \bmod Z, j}$ is connected to a constraint node $c_{a-k \bmod Z, b}$ for k=1, ..., Z.

Large LDPC Graph

The techniques of the present application for representing a large graph using much smaller graph representation and rotation information may be explained further with reference to FIGS. 9-16 which relate to vectorization of the graph 300 in FIG. 3. The techniques of the present application described with reference to these figures may be applied to much larger LDPC graphs.

A larger graph may be generated by replicating, i.e., implementing multiple copies, of the small graph shown in FIG. 3 and then performing rotation operations to interconnect the various copies of the replicated graph. For discussion purposes, the small graph within the larger graph structure will hereinafter be referred to as the projected graph.

Figures 9, 10:
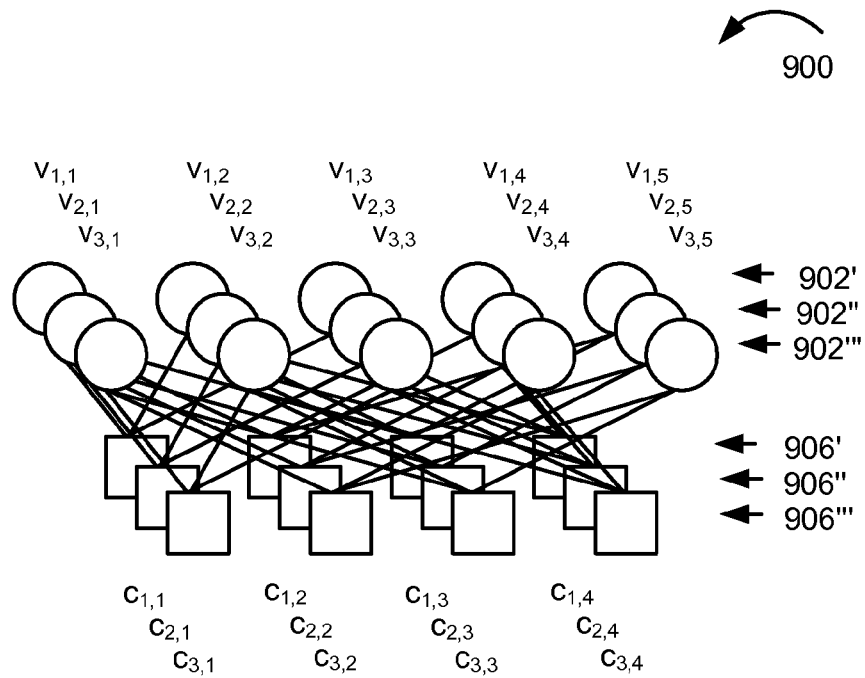
FIG. 9 illustrates a large bipartite graph representation of a regular LDPC code of length ten.
FIG. 10 illustrates the parity check matrix representation of the LDPC graph illustrated in FIG. 9.

FIG. 9 illustrates a large graph 900 which is the result of making 3 parallel copies of the small graph illustrated in FIG. 3. Variable nodes 902', 902" and 902'" correspond to the first through third graphs, respectively, resulting from making three copies of the FIG. 3 graph. In addition, check nodes 906', 906" and 906'" correspond to the first through third graphs, respectively, resulting from making the three copies. It should be noted that there are no edges connecting nodes of one of the three graphs to nodes of another one of the three graphs. Accordingly, this copying process, which "lifts" the basic graph by a factor of 3, results in three disjoint identical graphs.

FIG. 10 illustrates the result of the copying process discussed above using matrices 1002 and 1004. It should be noted that to make three copies of the original FIG. 3 graph, each non-zero element in the matrix 402 of FIG. 4 is replaced with a 3×3 identity matrix. Thus, each one in the matrix 402 is replaced with a 3×3 matrix having 1's along the diagonal and 0's everywhere else to produce the matrix 1002. It should be noted that the matrix 1002 has 3 times the number of edges that the matrix 402 in FIG. 4 has, 12 edges for each one of the 3 copies of the basic graph shown in FIG. 3. Here, variable xij may correspond to variable node Vij.

Modification of Encoder

The encoder 800 of FIG. 8 may be modified to encode the (Z=3) parallel graphs described above. The unit operation processor 1008 may be made a vector unit operation processor, able to process 3 identical operations simultaneously in parallel. All outputs from the unit operation processor 1008 may be vectorized, thereby carrying 3 times the data previously carried. The encoding memory 1006 may be made 3 times wider, capable of writing or reading 3 bits in parallel using at the direction of a single SIMD instruction. Outputs from these memories may be 3-bit wide vectors. However, the unit operation control 1010, ordering (read/write) control 1004 and encoder timing control module 1002 may remain the same as or similar to the like named elements of FIG. 8.

Rotations

Rotations may be introduced by replacing each of the 3×3 identity matrixes shown in FIG. 10 with 3×3 cyclic permutation matrices as shown in FIG. 11. It should be noted that there may be three possibilities for the cyclic permutation matrix used in FIG. 11. It may be possible to indicate the particular permutation matrix to be substituted for an identity matrix by indicating whether the permutation matrix has a "1" located in the first, second or third position in the first row of the permutation matrix. For example, in the case of matrix 1102, beginning at the top left and proceeding to the bottom right corner the rotations may be specified by the sequence (2, 2, 3, 3, 1, 1, 1, 3, 2, 1, 2, 3).

FIG. 12 illustrates the effect of performing the cyclic permutation (rotation) on the constraint node side. Since the permutation may be performed from the constraint node side, the relationship between the edges, e.g., ordering, from the variable node side remains unchanged as shown in rows 1202', 1202" and 1202'". From the constraint side, however, the permutation results in edges within a column, e.g., the edges within a specific vector edge, being reordered as shown in rows 1204', 1204", 1204'". This may produce interconnections between nodes corresponding to different copies of the projected graph.

It should be noted that as a result of the vector edge permutation, operation, constraint node $C_{1,1}$ may now connected to edge (2,1) as opposed to edge (1,1), constraint node $C_{2,1}$ may be coupled to edge (3,1) as opposed to edge (2,1) and constraint node $C_{3,1}$ may be coupled to edge (1,1) as opposed to edge (3,1).

By introducing switches into the message paths to perform rotations, the LDPC code may be encoded as defined in FIG. 11.

The vector encoding process can be further appreciated by applying the general LDPC encoding procedure described above. Instead of working on binary data, the encoder works on a vector of Z bits, corresponding Z parallel copies of the bit in the projected graph. Parity check matrix H 1102 may comprise entries of Z×Z all zero matrix or Z×Z cyclic permutation matrix represented by $\sigma^k$, $k \in [0, Z-1]$. Multiplication of cyclic matrix $\sigma^k$ with a Z-bit binary vector may be equivalent to right-shifting the vector by k bits. In the field of $GF(2^z)$, the encoding process may be treated the same as the binary data case, with the exception that when testing the invertability of φ, the matrix may be first brought back into binary representation.

Example of Encoding Process

Figure 14:
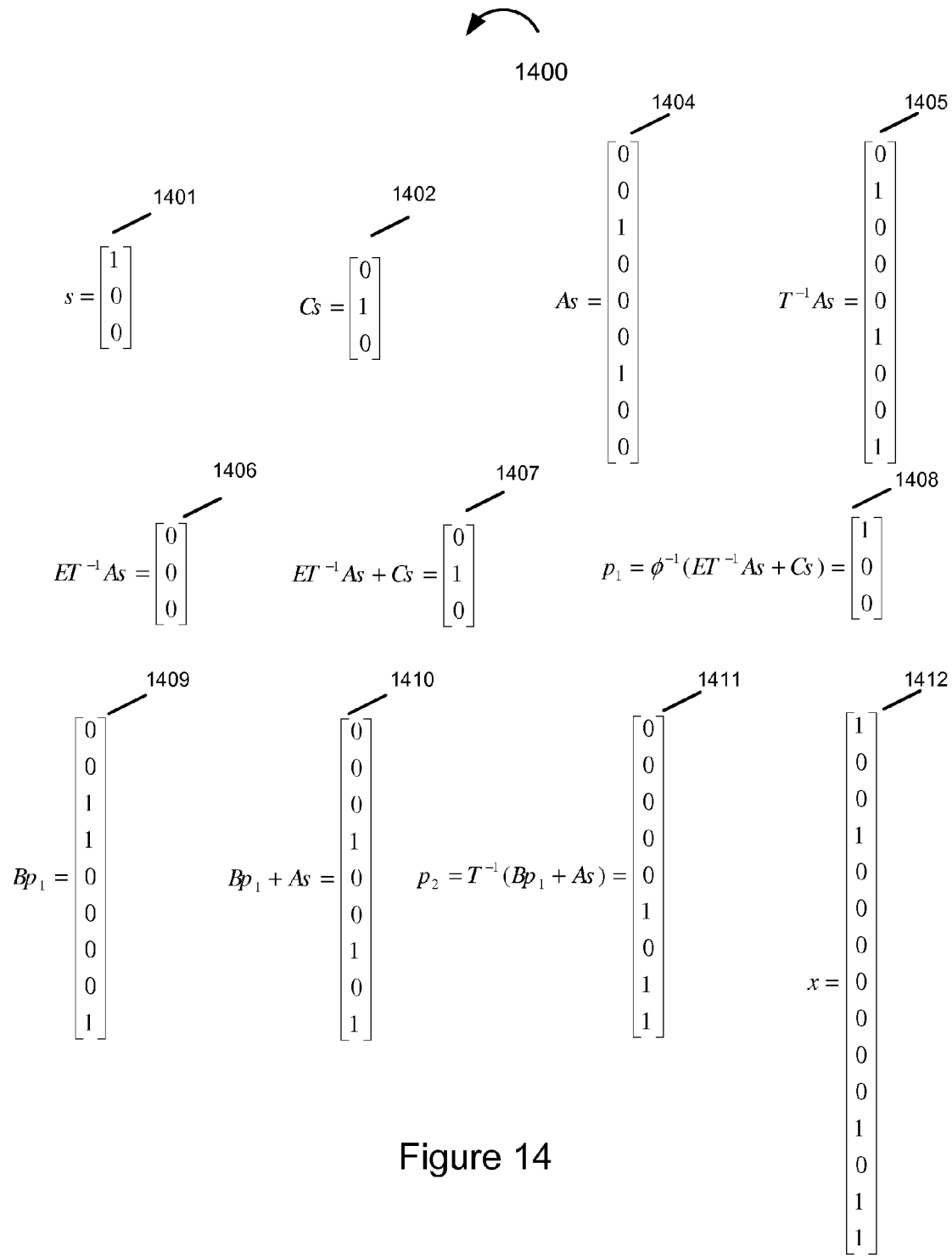
FIG. 14 illustrates the process for encoding an information block given the pre-computed matrices for the example LDPC code illustrated in FIG. 11.

FIGS. 13 and 14 illustrate an example encoding process for the LDPC code shown in FIG. 11. The encoding preprocessing step may rearrange the rows and columns of the parity check matrix H into a lower triangular form. One example rearrangement H' 1301 is illustrated in FIG. 13. H' 1301 may be obtained by permuting rows 2 and 4 of the original matrix H' 1102.

In constructing an encoder, pre-processing may extract and store certain information. Matrix A 1302 may be the sub-matrix (1, 3; 1, 1) of matrix H' 1301. Matrix B 1303 may be the sub-matrix (1, 3; 2, 2). Matrix T 1304 may be the sub-matrix (1, 3; 3, 5), which is of lower triangular form. Matrix C 1305 may be the sub-matrix (4, 4; 1, 1). Matrix D 1306 may be the sub-matrix (4, 4; 2, 2). Matrix E 1307 may be the sub-matrix (4, 4; 3, 5). The derivation of $\phi = (-ET^{-1}B+D)$, by Gaussian elimination, is illustrated in 1308 and 1309; its inverse $\phi^{-1}$ 1310 is then computed.

Given the off-line pre-computed matrices, FIG. 14 illustrates the actual encoding process for an example information block s=[100] 1401. Matrix multiplication with vector calculates vectors Cs 1402, As 1404, $T^{-1}As$ 1405, $ET^{-1}As$ 1406, $ET^{-1}As+Cs$ 1407, $p_1=\phi^{-1}(ET^{-1}As+Cs)$ 1408, $Bp_1$ 1409, $Bp_1+As$ 1410, and $p_2=T^{-1}(Bp_1+As)$ 1411. The resulted codeword is shown in 1412.

Similar to binary matrix multiplication decomposition described above and illustrated in FIG. 7, the above matrix operations in the field of $GF(2^z)$ may be decomposed into a sequence of simple operations when incorporating rotations, i.e. cyclic shifts. Two instructions—(0 a r b) and (1 a r b)—, may be defined as follows: (0 a r b) instructs the processor to read out the value at location b, left cyclic-shift it by r, and write the result to location a; (1 a r b) instructs the processor to read out the value at location b, left cyclic-shift it by r, and add the result to the value at location a.

Decomposition of a Multiplication Matrix

When decomposing a multiplication of matrix U (m×n) comprising entries of Z×Z cyclic matrices or zero matrices with a vector v (n×1) of Z-bit data, it may be assumed that prior to multiplication, source data may be held at locations s, s+1, . . . , s+n−1 in some memory of Z-bit data width; the result data is to be stored at locations t, . . . , t+m−1 in the same memory. It may also be assumed further that row i, $i \in [0, m-1]$ of matrix U has nonzero entries, i.e. $\sigma^k$, $k \in [0, Z-1]$, at columns $l_{i,1} l_{i,2}, \ldots, l_{i,k_i}$, with cyclic-shift values $u_{i,1}, u_{i,2}, \ldots, u_{i,k_i}$ $\in [0, Z-1]$. Given those assumptions, multiplication of U with v is equivalent to the following sequence of operations: (0 t $u_{0,1}$ s+$l_{0,1}$), (1 t $u_{0,2}$ s+$l_{0,2}$), . . . , (1 t $u_{0,k_0}$ s+$l_{0,k_0}$); (0 t+1 $u_{1,1}$ s+$l_{1,1}$), (1 t+1 $u_{1,2}$ s+$l_{1,2}$), . . . , (1 t+1 $u_{1,k_1}$ s+$l_{1,k_1}$); . . . ; (0 t+m−1 $u_{n-1,1}$ s+$l_{n-1,1}$), (1 t+m−1 $u_{n-1,2}$ s+$l_{n-1,2}$), . . . , (1 t+m−1 $u_{n-1,j_{n-1}}$ s+$l_{n-1,k_{n-1}}$). The total number of instructions is the same as the number of non-zero entries in the matrix.

Encoding Process

Figure 15:
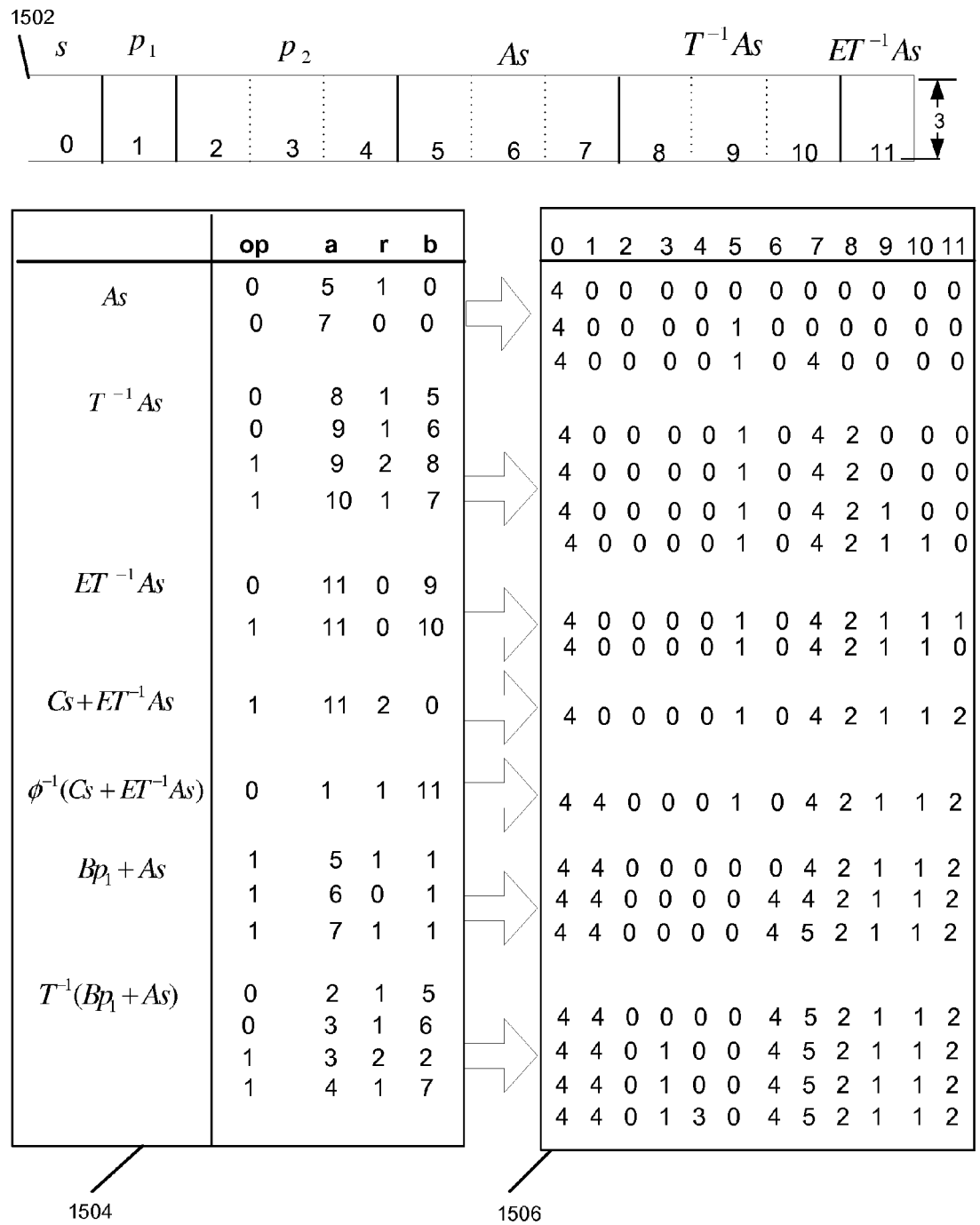
FIG. 15 illustrates an LDPC encoding process as a sequence of operations.

FIG. 15 illustrates the encoding process as a sequence of operations (0 a r b) and (1 a r b) for the vector LDPC code shown in FIG. 11. A memory 1502 may store information bits, coded bits, and intermediate variables. The content of each of the memory locations 0' through 11' is shown in row 1503 above the corresponding memory location. Memory may be of Z-bit data width, i.e., the accessing unit by a simple SIMD instruction is a Z-bit vector and each memory location 0' through 11' holds Z bits. Location 0' of the memory 1502 may be assigned to store the single information vector s; location 1' may be assigned to store parity vector $p_1$; locations 2' to 4' may be assigned to store parity vectors $p'_2$. Additional memory space may be provided to hold intermediate values. The memory 1502 may provide locations 5' to 7' to store the value of As and later that of $Bp_1+As$; it may provide locations 9' to 11' to store $T^{-1}As$; it may provide locations 12' to store $ET^{-1}As$.

With respect to the above allocation of the memory 1502, the encoding process illustrated in FIG. 14 as matrix multiplication with vectors is decomposed into a sequence of operations (0 a r b) or (1 a r b) listed in Table 1504. For clarity, Table 1504 shows the sequence of instructions together with their respective matrix multiplication counterparts. For example, multiplication As may be decomposed to two instructions: (0 5 1 0) followed by (0 7 0 0). The same information bits as in FIG. 14 may be encoded by storing s=[100] into location 0, as illustrated in the first row of Table 706. Operations executing instructions (0 5 1 0) and (0 7 0 0) may give the result As=(001, 000, 100) in locations from 5' to 7', the same as its counterpart in FIG. 14. Table 1506 illustrates the complete encoding process in terms of the content of memory 1502 as the sequence of instructions is executed.

The instructions listed in Table 1504 may be readily translated into a hardware implementation. Numerous variations of the instruction set may be possible, including e.g. removing redundancy in the instruction set, adding instructions in the instruction set to avoid initializing the memory, or optimizing the instruction set to conform to memory operation characteristics. Such variations may be considered within the scope of the present application.

Encoder

Figure 16:
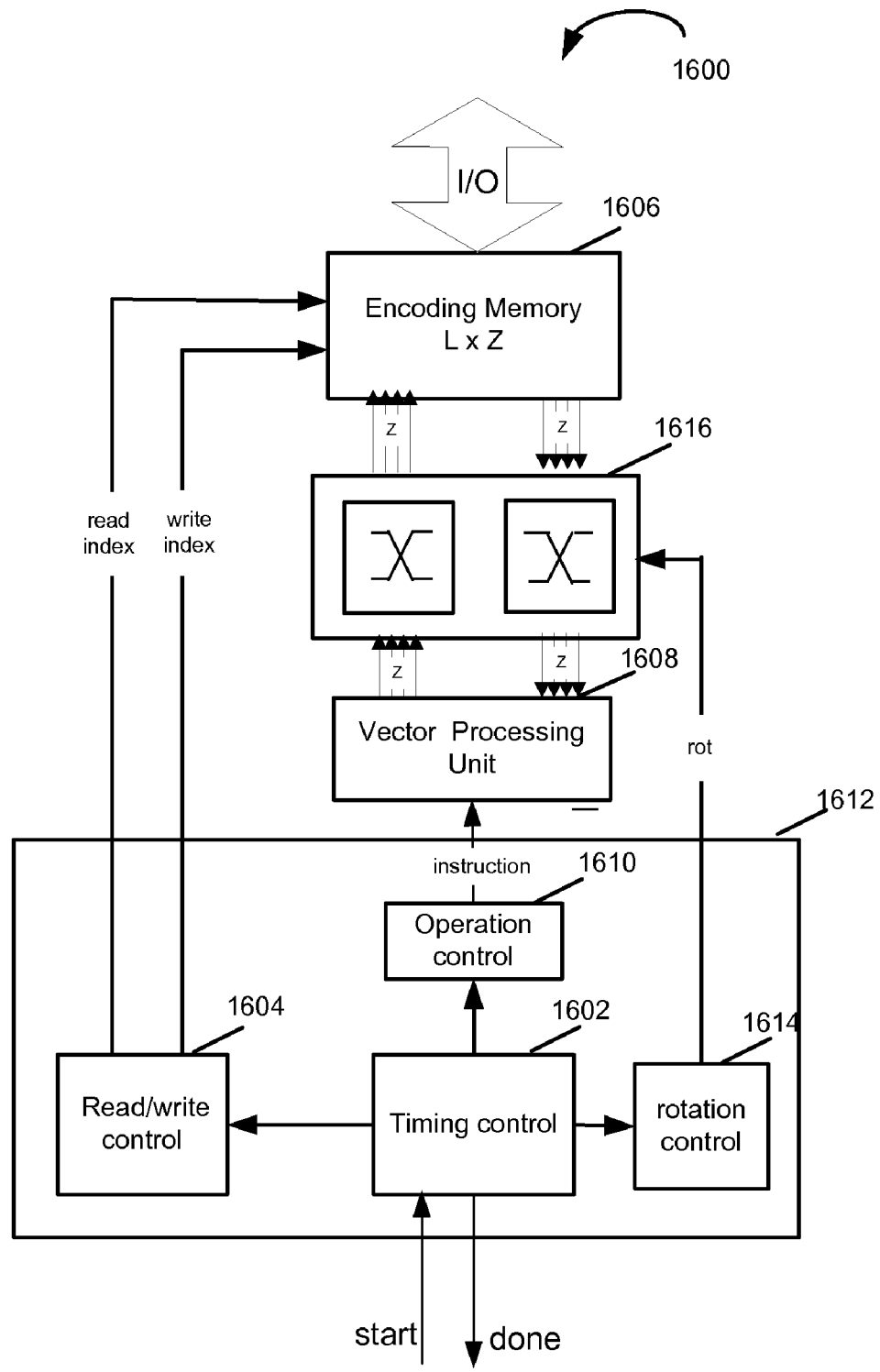
FIG. 16 illustrates an LDPC encoder that vectorizes the encoder of FIG. 7.

FIG. 16 illustrates an encoder 1600. Encoder 1600 may fully vectorize, with rotations, encoder 800. Similarities between encoder 1600 and encoder 800 may be apparent. In particular the encoder control module 1612 and the operation control module 1610 may function in the same or similar manner as their respective counterparts 802 and 812 in encoder 800. For example, to encode the LDPC code defined in FIGS. 12 and 13, the operation of these components would be exactly the same as their counterparts in encoder 800 when encoding the example code 300 in FIG. 3. The encoding memory 1606 may be a vectorized version of its counterparts 806 in encoder 800. Whereas, in encoder 800, the memories stored single bits, the corresponding memories in encoder 1600 may store sets, i.e., Z-bit vectors. These vectors may be written and read as single units using SIMD instructions. Thus, the message identifiers sent to the memory from the ordering (read/write) control 1604, i.e., memory indices, may be equivalent or similar to those in encoder 800. The ordering or read/write control module 1604 has the additional role, beyond that of its counterpart 804 in encoder 800, of storing and providing the permutation, e.g., rotation, information.

In the encoding example 300, encoder 800 stored in its ordering module 1004 the sequence of single steps, which together perform a series of matrix multiplications. Consider using encoder 1600 to encode the code of FIG. 11. The ordering module 1604 may store the same above sequence for accessing Z-bit vectors during encoding, and also store the sequence which describes the rotations associated to the same sequence of Z-bit vectors. This sequence serves as the basis to generate the rot signal which is used by the ordering module 1604 to cause the switch 1616 to rotate vectors. The vector unit operation processor 1608 is the same as its counterpart 808 in encoder 800, except it is operating on (clearing, accumulating, or outputting) Z-bit vectors instead of single bits.

Some variations on the encoding methods and apparatus discussed above may result in reduced complexity in the case of some implementations. The following are some variations that may reduce the memory requirement for both the control memory 1604 and the encoding memory 1606 discussed above. An implementation may incorporate one or more of the changes described below.

First, the instruction representation may be simplified: As described above, an encoding instruction set is, in various embodiments, an ordered sequence of two basic instructions (0 a r b) and (1 a r b), which when executed produces the actual encoding. Such an instruction sequence may be generated by consecutively decomposing multiplications of some matrix with some vector into a sequence of basic instructions. Some example decompositions include an overwhelming percentage of sub sequences of the following pattern: (0 a $r_0$ $b_0$), (1 a $r_k$ $b_k$), . . . , (1 a $r_k$ $b_k$). The repetition of a in this sub-sequence may be redundant. This redundancy may be readily removed by modifying the basic instruction. Henceforth, two new instructions may be defined—(0 0 a) and (1 r a)—as follows: (1 r a) may instruct the processor to read out the value at location a, left cyclic-shift it by r, and xor the value to the current value in an accumulator; (0 0 a) may instruct the processor to write the current value in the accumulator to location a, and reset the value in the accumulator to zero. The transformation from the old instructions to the new instructions may be as follows: (0 a r b) may be transformed to (1 r b), (0 0 a); and (1 a r b) may be transformed to (1 0 a), (1 r b), (0 0 a). Following this rule, the example sequence (0 a $r_0$ $b_0$), (1 a $r_1$ $b_1$), . . . , (1 a $r_k$ $b_k$) may be transformed to (1 $r_0$ $b_0$), (1 $r_1$ $b_1$), . . . , (1 $r_k$ $b_k$), and (0 0 a), thus removing the redundancy. Transforming the instruction set in this manner may reduce the amount of memory required to implement the encoding memory 1606.

Next, the cardinality of the instruction set may be reduced: When treating LDPC encoding as a sequence of matrices and vectors multiplications 1600, the encoding process may be roughly divided into three stages. In the first stage, $T^{-1}As^T$ may be obtained by first solving $As^T$ then solving $Tz=As^T$; in the second stage, $p_1^T$ may be obtained; and in the last stage given $p_1^T$, $p_2^T$ may be obtained by solving $Tp_2^T=-As^T-Bp_1^T$, which may be done efficiently using back-substitution. In the original form, matrices and vector multiplications in each stage may be decomposed into an instruction subset. A sequential concatenation of those three subsets may be the complete instruction set and the end of the instruction set implies the end of encoding process. However, sharing the instruction subset between the first stage and the last stage may be possible and thus may reduce the cardinality of the instruction set.

It may be noted that $T^{-1}As^T$ may be obtained by solving $Tp_2^T=-As^T-Bp_1^T$ if $p_1^T$ is initialized to zero. Next, the sequence of instructions to be the concatenation of the instruction subset for the last stage and for the second stage may be defined. So now encoding may comprise 1) initialize $p_1^T$ to be zero; 2) run the instruction subset for the last stage (obtain $T^{-1}As^T$) 3) run the instruction subset for the second stage (obtain $p_1^T$); 4) run the instruction subset for the last stage again (obtain $p_2^T$).

This instruction set sharing may reduce the memory in the encoder control device 1612, and it may also reduce the encoding memory 1606 as $T^{-1}As^T$ may now be saved at the location for $p_1^T$ and there may be no need in saving.

Base Encoding Structure

Figure 17:
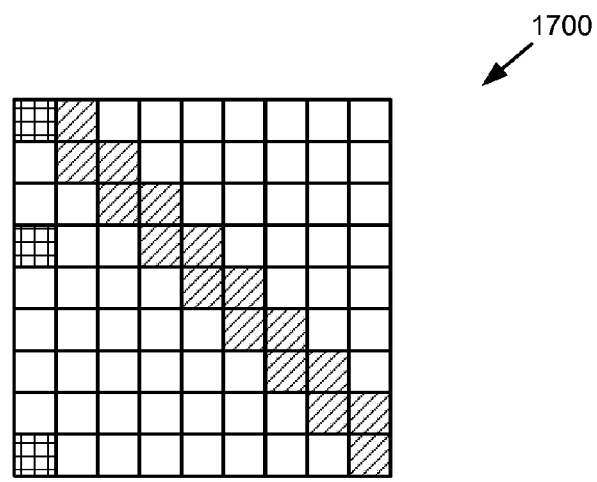
FIG. 17 illustrates a parity check matrix of a base graph.
Figure 18:
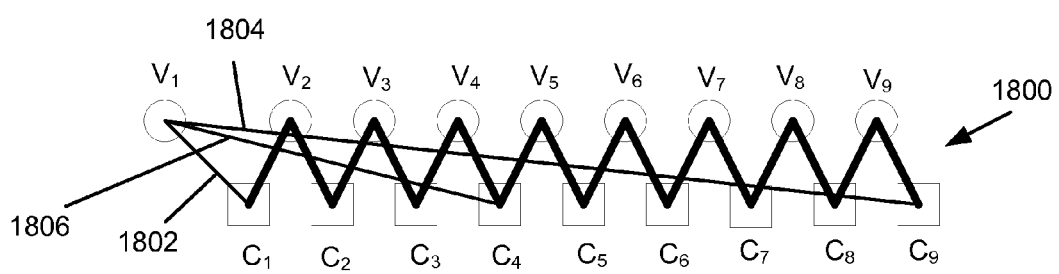
FIG. 18 illustrates a Tanner graph of a base encoding structure.

FIG. 17 illustrates a parity check matrix 1700 (boxes containing a graphic symbol indicate 1 and boxes having no graphic symbols or that are empty indicate 0) and FIG. 18 illustrates a Tanner graph, both representations of a Base Encoding Structure A, described below. When the graph in FIG. 18 is lifted, each entry in the matrix, depicted here as a square, may become a permutation matrix or a zero matrix. The zero matrices correspond with the empty boxes and the permutation matrices correspond with the boxes having graphic symbols. In the case of a cyclic lifting, the permutation matrices may be cyclic permutation matrices. It should be understood that in a presentation of the structure as a parity check matrix, the rows and columns may appear permuted. Similarly, the Tanner graph may appear in a permuted fashion. Furthermore the matrix and the graph may be sub-matrices and sub-graphs of a larger structure.

The projected graph may also be known as a base graph. The complete graph may be known as a lifted graph. The lifted graph may be obtained by making Z copies of the base graph and permuting like edges among the copies. For simplicity, cyclic permutations is focused on.

A convenient encoding structure to have in the base graph may be an accumulate chain of degree two variable nodes together with a single degree three variable node. The structure consists primarily of a single loop 1800 passing through all degree two variable nodes $V_2$-$V_9$ in the accumulate chain and the degree three variable nodes $V_1$. Two of the edges (1802, 1804) on the degree three variable node participate in the loop. The third edge 1806 on the degree three variable node V1 may be incident to an arbitrary check node from the loop, leaving the associated parity check matrix invertible. (In FIG. 18, check nodes may include $C_1$-$C_9$.) This encoding structure may be referred to as base encoding structure A and is shown in FIG. 18. In some embodiments, the degree three node $V_1$ may not form a loop that includes all degree nodes in the accumulate chain. This encoding structure may be referred to as base encoding structure B. Base encoding structure A may therefore a special case of base encoding structure B.

Figure 19:
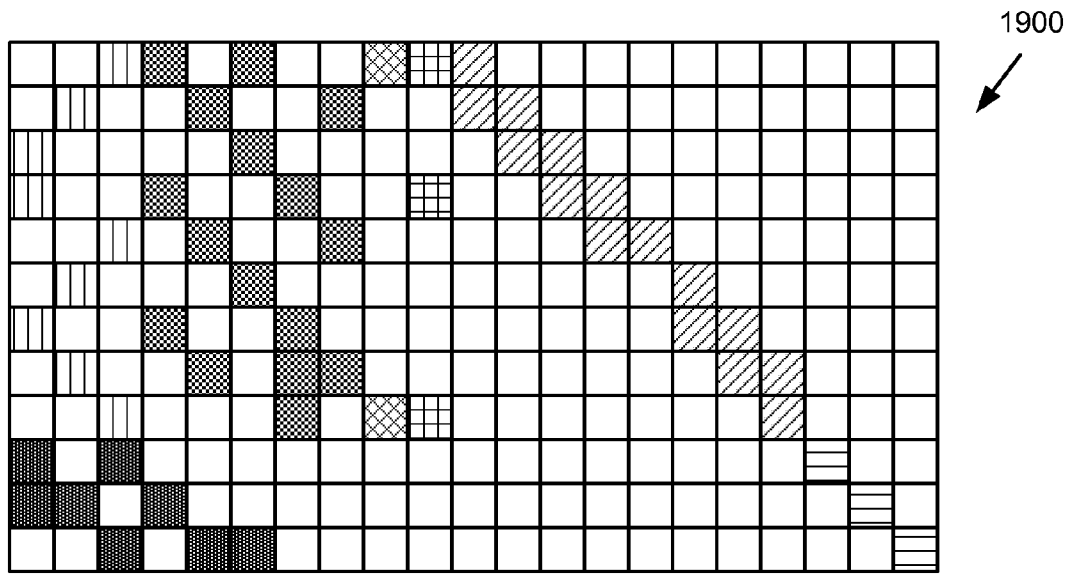
FIG. 19 illustrates a parity check matrix representation of more complete base graph that the graph of FIG. 17.

The core of the base graph may consist of the above described structures together with additional variable nodes that may connect to the constraint nodes participating in the above-mentioned loop. There may be additional parity check bits formed from the variable nodes belonging to the core of the base graph 1900, as shown in FIG. 19.

Figure 20:
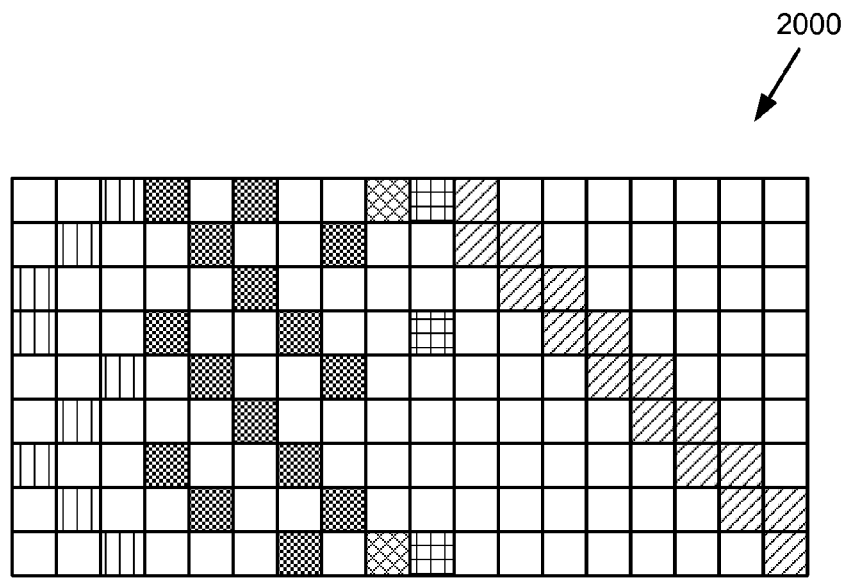
FIG. 20 illustrates a parity check matrix representation of more complete base graph stripped of degree one variable nodes and associated edges.

Encoding of degree one variable nodes may be very simple once all other bits are determined. Therefore, for encoding, the first focus may be on the structure stripped of these nodes. FIG. 20 gives an example 2000 corresponding to FIG. 19 without stripped nodes. The resulting structure may be referred to as the core. When the core contains base encoding structure A as a substructure, as in the example in FIG. 19, then using base encoding structure A may entail setting the other variable nodes as information nodes, which may also be referred to as systematic nodes. The values of the bits associated to these nodes are assigned from the information bits. The bits associated to base encoding structure A may then be computed to complete the encoding. Once the value of the degree 3 variable node in base encoding structure A is determined, then the accumulate chain bits are determined by a simple convolution-like process. If all the constraints in the core base graph over GF[2] are added, that is, noting that an even number of edges from a constraint to a variable node is equivalent, in encoding, to 0 edges and an odd number of edges from a constraint to a variable node may be equivalent to 1 edge, then it may be observed that the degree 3 node in base encoding structure A may be written as a simple parity of the information variable nodes of odd degree in the core base graph.

If, when the graph is lifted, each pair of edges associated to a degree two variable node in the accumulate chain may be given the same lifting value, then a key property described above for the core base graph may be preserved for the core lifted graph. In particular, adding up the lifted parity permutation matrices, analogous to adding the constraints in the base graph except now in a block-wise fashion, the edges associated to the degree two nodes in the accumulate chain effectively cancel each other leaving the degree three lifted variable node as parity of the information lifted nodes. The resulting matrix associated with the degree three variable node is the $\Phi$ matrix.

In one embodiment of lifting base encoding structure B, the rotation values on two of the edges associated with the degree three node may take the form s and s+L/4 while the third edge takes an arbitrary different value. Here, s is an arbitrary integer and L is the lifting size. In this case, the matrix $\Phi^{-1}$ may turn out to be the sum of at most nine permutation matrices, i.e. multiplication by $\Phi^{-1}$ involves permuting a vector at most 9 times and adding the at most nine copies. This encoding structure may be referred to as lifted encoding structure B.

In another embodiment of lifting base encoding structure B, the rotation values on two of the loop edges associated with the degree three node may take the form s and s+L/2 while the third edge takes an arbitrary different value. In this case, the matrix $\Phi^{-1}$ may turn out to be the sum of at most three permutation matrices, i.e. multiplication by $\Phi^{-1}$ involves permuting a vector at most 3 times and adding the at most three copies. This encoding structure may be referred to as lifted encoding structure C.

In another embodiment of lifting base encoding structure B, the rotation values on two of the edges associated with the degree three node may take the value s while the third edge takes an arbitrary different value. In this case, the matrix $\Phi^{-1}$ may turn out to be a single permutation matrix, i.e. multiplication by $\Phi^{-1}$ involves only a simple permutation. This encoding structure may be referred to lifted encoding structure D.

It should be noted that lifted encoding structures B, C and D may all be liftings of base encoding structure B. In some embodiments, the two specified edges of the degree three node may be the two loop edges of the degree three node in base encoding structure A. Among lifted encoding structures B, C and D, D may have the least complexity while B may have the most complexity and C may be somewhere in between. Conversely, the advantage of B may be that, in the lifted graph, the loop passing through the degree-2 nodes may also pass through four degree-3 nodes, which may improve the performance of the graph, especially at high signal-to-noise rations. In contrast, in structure C, the loop through the degree-2 chain may pass through only two degree-3 nodes, while in structure A, it may pass through only one degree-3 node. Thus, the encoding structures B, C and A may provide different trade-offs between performance and complexity.

For most lifted versions of the encoding structure B, with the aforementioned constraint on the permutations associated to the accumulate chain the $\Phi$ matrix will be the sum of three permutation matrices. If two of the edges of the degree three node have the same permutation then the $\Phi$ matrix may be a permutation matrix. This may be the case for lifted encoding structure D. If lifted encoding structure D is a lifting of base encoding structure A and the edges with the same permutation are the two lifted loop edges from the degree three base node then this structure may be referred to lifted encoding structure A. If the rotation associated with the remaining uncancelled edge is 0, or if Φ is the identity matrix then the structure may be referred to as lifted encoding structure A with identity.

For a large degree of parallelism in the decoder it may be advantageous to have large values of the lifting size Z. Correspondingly it may be desirable to have small base graphs. This may create a difficulty in using the above-described encoding structure. Specifically, if the base graph is small then the accumulate chain may be quite short. When using the structure lifted encoding structure A, Z loops may be created that consists of one copy of the lifted degree 3 variable node and a chain of degree two nodes whose length is the base graph accumulate chain. This encoding loop is therefore quite short and this can result in bad performance of the code.

The structure presented here may allow effective increasing of the accumulate chain in the encoding loop from L to 2L+1 while maintaining the small base graph. The encoding structure A may appear, after expanding the base graph with lifting size Z, as one with base graph of twice the size and lifting size Z/2. This expansion does not change the graph, only its interpretation as a base graph and lifting.

Expansion

The set of integers $\{0, \ldots, Z-1\}$ is an interleaving of the set $\{0, 2, \ldots, Z-2\}$ and the set $\{1, 3, \ldots, Z-1\}$. A cyclic permutation on $\{0, \ldots, Z-1\}$ may be performed by cyclically shifting to the right by S and it may equivalently be represented as a cyclic permutation of the even elements $\{0, 2, \ldots, Z-2\}$ and the odd elements $\{1, 3, \ldots, Z-1\}$ and a reinterleaving of the two. The reinterleaving of the sequences may begin with the even subset if S is even and with the odd subset if S is odd. The cyclic shift of the even sequence may be K which is the largest integer at most S/2 and the cyclic shift of the odd sequence will be S−K.

Starting with a graph that is a lifting of size Z of a base graph, each base graph node may be duplicated, one being the even node and the other the odd node, reduce the lifting size to Z/2 and, using the representation described above, reproduce exactly the same graph as a lifting of size Z/2 of a base graph of twice the original size. If in the original graph a lifted variable node is connected to a lifted check node with permutation S, then after duplicating the nodes, the even copy of the variable node may connect to the even copy of the check node and the odd copy of the variable node may connect to the odd copy of the check node if S is even, and if S is odd, then the even variable node may connect to the odd check node and the odd variable node may connect to the even check node. The liftings associated to these two edges may be K and S−K.

The goal is to have the lifted encoding structure A appear in this twice-as-large base graph Z/2-lifted structure. The encoding structure should therefore be implicit in the original Z-lifted smaller base graph structure.

For this to occur, an additional degree 2 node that closes the loop of the accumulate chain may be added to base encoding structure A. In the base graph, this node has its edges paralleling two of those from the degree three node. When performing the lifting, the edges on this node may take integer values A and A−1, all values being interpreted as modulo Z. In this way the Z loops through the degree two nodes that would appear in Z copies of the base graph become a single loop Z times longer. In addition to this cyclic permutations on the loop edges of the degree three variable node in the encoding structure are integers B−1 and B modulo Z where in the base graph the B−1 permutation may be associated with the edge connected to the same constraint node as the edge on the loop degree two variable node that has lifting value A. Given this structure, the base graph may be expanded and the lifting size may be halved, as described above, so that resulting graph will contain lifted encoding structure A where one copy of the additional degree 2 variable node now participates in the encoding structure while the other does not and one of the two copies of the degree 3 variable node participate and the other does not.

Some generalizations may be possible here. First, assuming temporarily that the lifting Z is a power of 2, when expanding the base graph, the LSB of the lifting values S may be moved into the base graph. Different bits may be used. If the kth bit (currently k=0) is used, then instead of A−1 and B−1 above, A−2k and B−2k would result. In this case the lifted accumulate structure may not form a single large loop but several loops. Second, although this focus may be on powers of 2 for Z other values may be used. In general one can increase the base graph in this way by a factor F as long as F is a factor of Z.

An additional property desirable in some code designs is scalability of the lifting i.e. the same base graph may be used with different lifting sizes Z. Moreover, the liftings of different sizes are often derivable from a single lifting. In particular the focus may be on supporting Z values that are powers of 2 from 16 up to 512 or 1024. An additional goal may be to have the encoding structure as described above be preserved under the scaling. This constrains the scaling parameters. A scaling rule may be provided in which the lifting of the maximum lifting size is defined and smaller ones derived by removing the appropriate number of LSBs from the lifting value. This scaling law can in general be expressed as follows. If S is the lifting associated to lifting size Zmax, then the lifting associated to lifting size Z1 may be the largest integer at most S*Z1/Zmax. It is desirable to have the encoding structure preserved under scaling. There are two special lifting values numbers namely 0 and −1 mod 2n that are always preserved under scaling of this type. Therefore if the encoding structure uses only these two values then it will be preserved under scaling.

One option therefore is to have lifting values of 0 and −1 on the loop edges of the degree-3 node and an arbitrary value on the non-loop edge. When this base graph is expanded by 2, it has lifted encoding structure A. This structure may be preserved under scaling by all powers of two, since the values 0 and −1 may be preserved under such a scaling. Also, the lifted encoding structure A may now be used which means that $\Phi^{-1}$ is a permutation matrix in the expanded graph.

Another possibly desirable feature is to have the permutation on the non-loop edge of the degree 3 encoding node to be 0 that is to have lifted encoding structure A with identity. This conflicts with having all other cyclic permutations in the encoding structure having a 0 or −1 value and simultaneously avoiding short loops of low degree variable nodes in the graph.

If, however, the preservation of the encoding structure is only down to some minimum lifting size larger than 2, 16 for example, then values other than 0 and −1 may be used.

A main feature of the degree two lifted loop structure and the degree 3 encoding column is that the lifting permutations take the values K and K−1 for some integer K. Only K=0 may preserve this for all liftings down to size 2. If, however, this property is to be preserved down do liftings of size 16 then different values for K may be chosen. If K is n bits in length, corresponding to $Z=2^n$ with n greater than or equal to 4, then it may be chosen that the n−3 LSBs of K to be 0 while the others are arbitrary. It follows that the n−3 LSBs of K−1 mod $2^n$ are 1. In this case the main feature of the lifting values differing by 1 is preserved. For example, if K is such an n-bit number and J is the m-bit number given as the first m bits, in other words the m MSBs, of K where m is 4 or larger, then J−1 modulo $2^m$ is equal to the m MSBs of K−1 modulo $2^n$. In other words, if the n−m LSBs from K and K−1 are dropped, then the result is a binary representation of J and J−1 modulo $2^m$. This may be used to set the permutation on the non-loop edge of the degree 3 in the encoding structure so that in the expanded encoding structure the copy of the encoding degree 3 variable node that participates in lifted encoding structure A has its non-loop edge lifted with permutation value 0. Thus the expanded encoding structure is lifted encoding structure A with identity. An n bit number in which the last n−3 bits are 0 will be referred to as an n−3 0-bit number.

Figure 21:
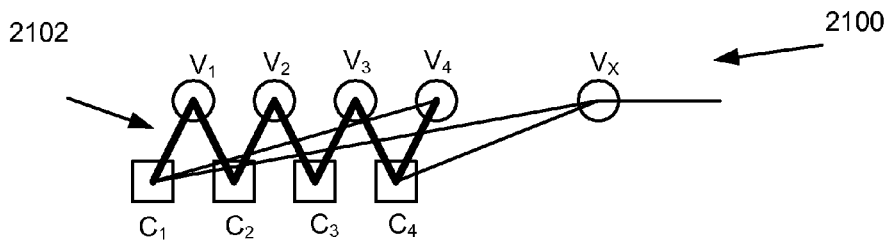
FIG. 21 illustrates an extension of a base encoding structure with additional degree two variable node closing the accumulator chain to form a loop.

FIG. 21 illustrates an extension of the base encoding structure A, having variable nodes $V_1$-$V_4$ and constraint nodes $C_1$-$C_4$, with an additional degree two variable node $V_x$ closing the accumulator chain to form a loop 2102.

Figure 22:
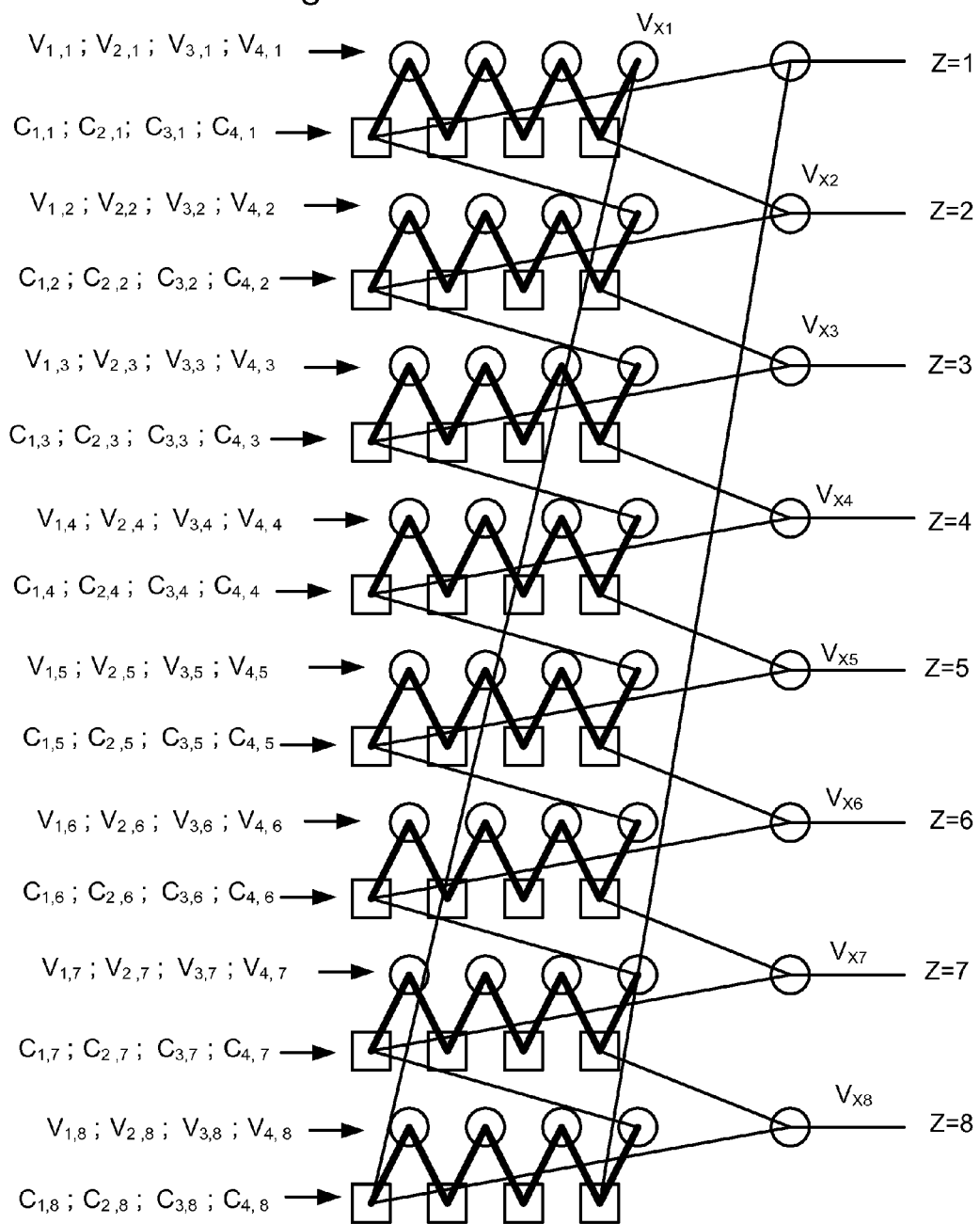
FIG. 22 illustrates a lifting of Z=8 of the extended base encoding structure of FIG. 21.

FIG. 22 illustrates a lifting of Z=8 of the extended base encoding structure A 2100 in FIG. 21. Graphic symbols are used to distinguish odd and even copies. In this figure only shifts of 0 and −1 are used. The non-loop edge of the degree three node is not shown attached and its permutation is not given. Due to the choice of permutations on the loop edges of the lifted degree three node this does not represent a lifted encoding structure A. Variable nodes $V_{x,z}$ may correspond to first through eighth graphs where x is the number of the graph and z is the lifting size. Constraint nodes $C_{x,z}$ may correspond to first through eighth graphs where x is the number of the graph and z is the lifting size.

Figure 23:
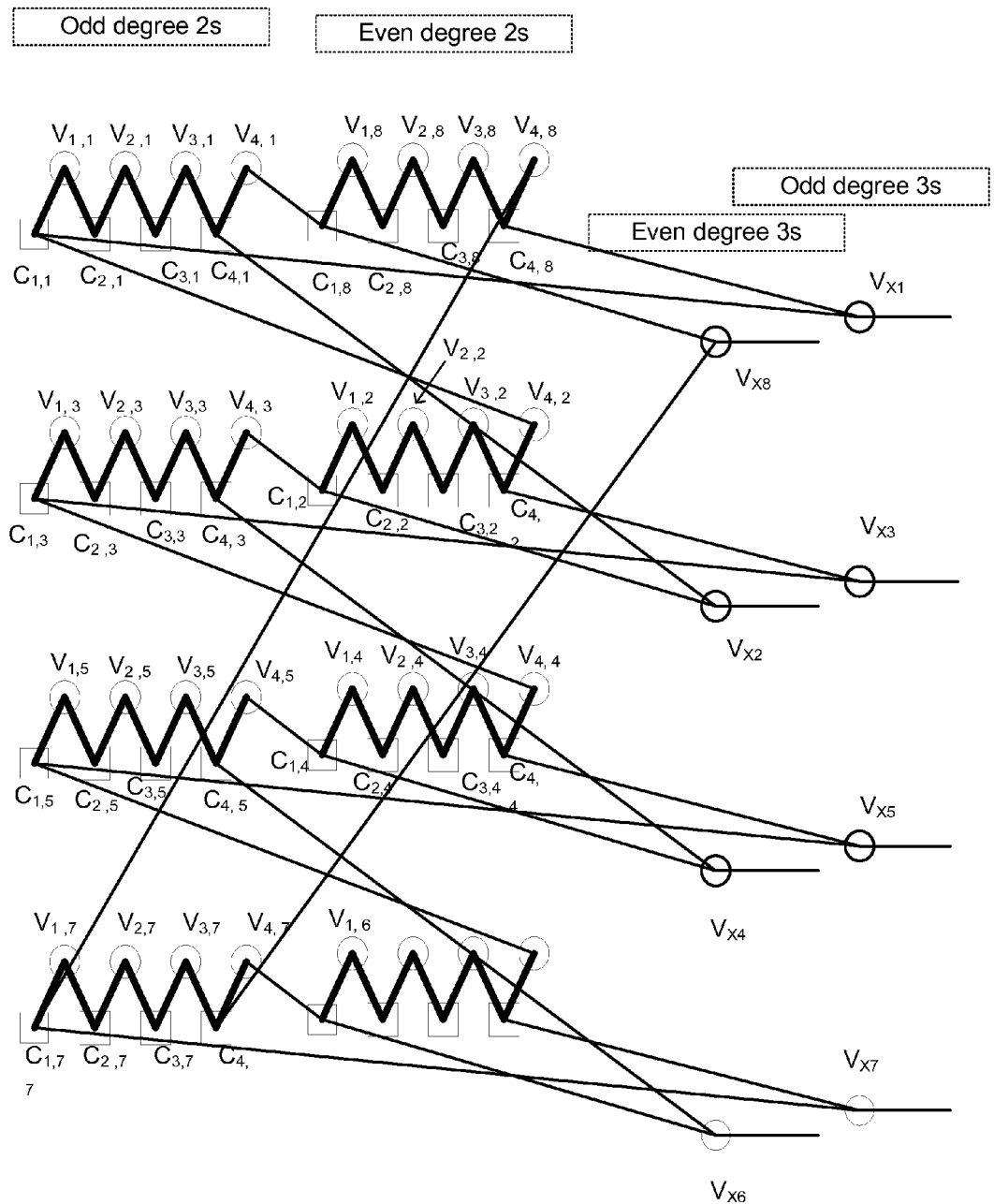
FIG. 23 illustrates an expansion of the graph in FIG. 22.

FIG. 23 illustrates an expansion of the graph shown in FIG. 22 as lifting of size 4 and doubled base graph. Note that the graph may now contain lifted encoding structure A using the odd degree 3s and half of the degree 2 that closed the accumulate loop in FIG. 22.

Parity Check Matrices

The above described application may be used in a Third Generation Partnership Project 2 (3GPP2) wireless communications system. Such a system is described to some extent in co-pending U.S. Provisional Patent Application Ser. No. 60/862,730, which is hereby incorporated by reference, and which forms a part of this application. Furthermore the stipulated encoding for these examples may be to use the lifted encoding structure A as the basis for encoding. In other words, the lifted encoding structure A that appears in the expanded graph represents the parity bits of the core. It should be understood that reordering the columns or variable nodes in the examples does not change the examples in a significant way. Similarly reordering the rows or constraint nodes does not change the examples. Similarly adding constants to all lifting values in a column may not change the example in a significant way.

Figure 24:
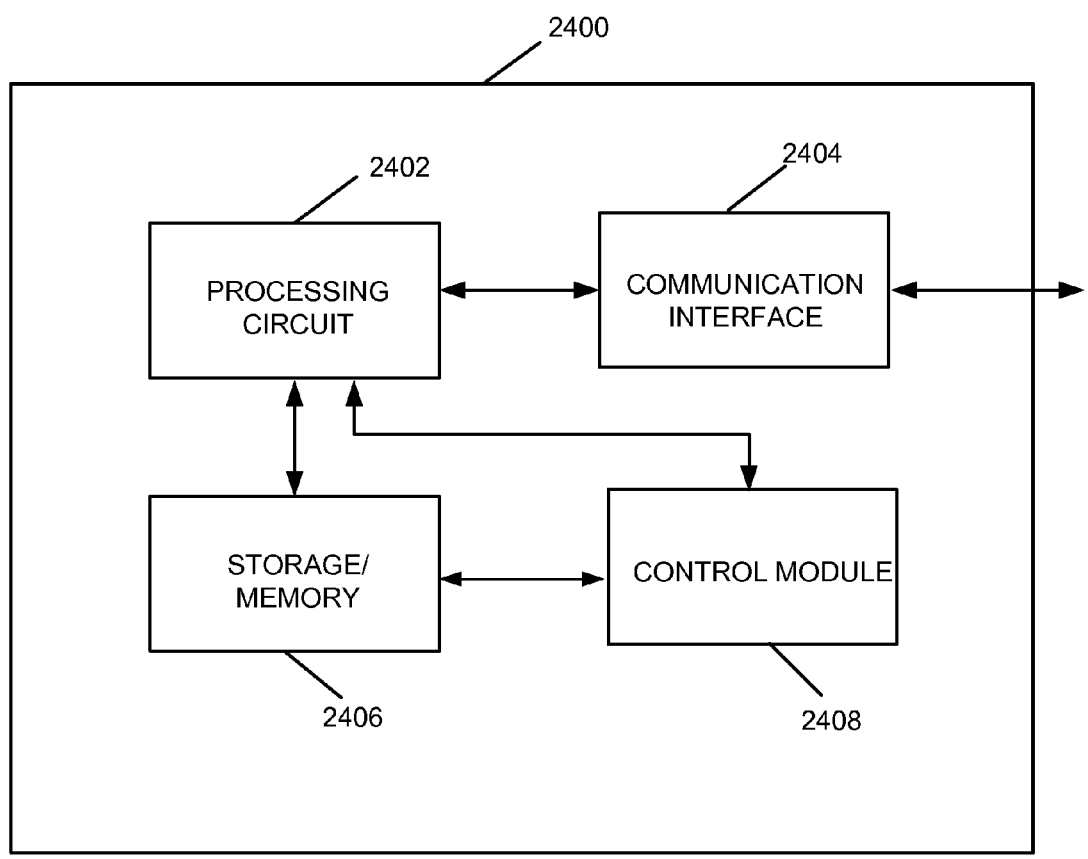
FIG. 24 is a block diagram illustrating an encoder for encoding data using a low density parity check (LDPC) code.

FIG. 24 is a block diagram illustrating an encoder 2400 for encoding data using a low density parity check (LDPC) code. The encoder may be capable of representation the encoded data with a bipartite graph. The encoder 2400 may include a processing circuit 2402 (e.g., processor, processing module, etc.) coupled to a communication interface 2704 that may be capable of receiving and transmitting data, and a memory device 2406 to store the encoded data. The processing circuit 2402 may be coupled to a control module 2408 to provide one or more instructions to the processing circuit 2402. The instructions may include, but are not limited to the order in which the memory device 2406 is accessed and the timing of the data flow. The processing circuit 2402 may perform functions that achieve the following: (a) generate an accumulate chain of a plurality of low degree variable nodes; and (b) close the accumulate chain to form a loop twice, once using a low degree variable node and once using a higher degree variable node than the low degree variable node, where the higher degree variable node comprises a non-loop-closing edge.

Figure 25:
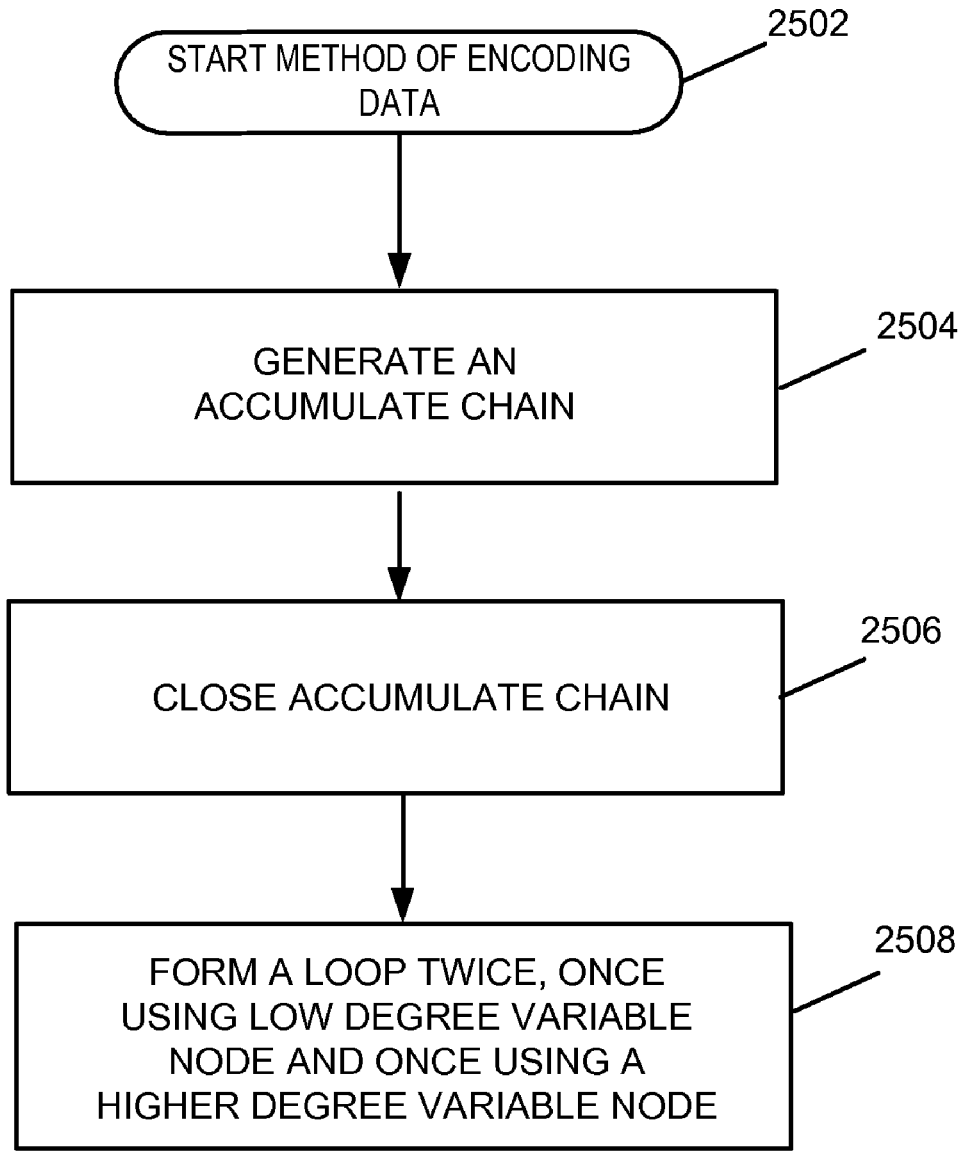
FIG. 25 illustrates an exemplary method operational on an encoder.

FIG. 25 illustrates an exemplary method operational on an encoder for encoding data using a low density parity check (LDPC) code. The encoder may be capable of representation the encoded data with a bipartite graph. Operation of the exemplary method when the encoder receives a low density parity check (LDPC) code for encoding 2502. Next, the encoder may generate an accumulate chain of low degree variable nodes 2504. In one configuration, the plurality of low degree variable nodes may have the same permutation on each edge. Next, the accumulate chain may be closed 2506 to form a loop twice, once using a low degree variable node and once using a higher degree variable node than the low degree variable node, where the higher degree variable node may comprise a non-loop-closing edge 2508.

According to another configuration, a circuit in an encoder may be adapted to encode data using a low density parity check (LDPC) code capable of representation by a bipartite graph. The same circuit, a different circuit, or a second section of the same or different circuit may be adapted to generate an accumulate chain creating a loop of a plurality of low degree variable nodes having a same permutation on each edge. In addition, the same circuit, a different circuit, or a third section of the same or different circuit may be adapted to close the loop using a low degree variable node and a higher degree variable node than the low degree variable node, where the higher degree variable node comprises a non-loop-closing edge. Similarly, the same circuit, a different circuit, or a fourth section may be adapted to use a lifted graph comprising a plurality of permuted copies of the accumulate chain, a plurality of permuted copies of the loop low degree variable node and a plurality of permuted copies of the higher degree variable node. One of ordinary skill in the art will recognize that, generally, most of the processing described in this disclosure may be implemented in a similar fashion. Any of the circuit(s) or circuit sections may be implemented alone or in combination as part of an integrated circuit with one or more processors. The one or more of the circuits may be implemented on an integrated circuit, an Advance RISC Machine (ARM) processor, a digital signal processor (DSP), a general purpose processor, etc.

In summary, the present application may provide many advantages, including one or more of, but not limited to, with regard to a base graph:

1. An accumulate chain with all degree two variable nodes may have the same permutation on each edge.
2. An additional degree two variable node, the loop degree two node, that closes the loop and a degree three variable node that also closes the loop. The third edge of the degree three variable node may be the non-loop edge.

and with regard to liftings:

3. The permutations on the loop degree two variable node edges are n−3 0-bit number A and A−1 mod $2^n$ where $2^n$ is the maximum lifting size.
4. The permutation on the loop edges of the degree three variable node are an n−3 0-bit number B and B−1 mod 2n where in the base graph the B−1 permutation is associated with the edge connected to the same constraint node as the edge on the loop degree two variable node that has lifting value A.
5. The permutation on the non-loop edge of the degree three variable node is C.

Furthermore, special cases may include C=0. When the structure is expanded, the expanded graph contains lifted encoding structure A and it may contain lifted encoding structure A with identity if C=0 where the lifted encoding structure A consists of all accumulate degree two variable nodes, half of the loop degree 2 variable nodes corresponding to one of the two copies of the loop degree two node that appears in the expanded base graph, and half of the degree three variable nodes corresponding to one of the two copies of the degree three node that appears in the expanded base graph.

The disclosed embodiments may be applied to any one or combinations of the following technologies: Code Division Multiple Access (CDMA) systems, Multiple-Carrier CDMA (MC-CDMA), Wideband CDMA (W-CDMA), High-Speed Downlink Packet Access (HSDPA), Time Division Multiple Access (TDMA) systems, Frequency Division Multiple Access (FDMA) systems, and Orthogonal Frequency Division Multiple Access (OFDMA) systems.

The signaling transmission techniques described herein may be implemented by various means. For example, these techniques may be implemented in hardware, software, or a combination thereof. For a hardware implementation, the processing units used to process (e.g., compress and encode) signaling may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. The processing units used to decode and decompress the signaling may also be implemented with one or more ASICs, DSPs, and so on.

For a software implementation, the signaling transmission techniques may be implemented with modules (e.g., procedures, functions, and so on) that perform the functions described herein, an may be stored on a machine readable medium, such as, for example, a compact computer disk. The software codes may be stored in a memory unit and executed by a processor. The memory unit may be implemented within the processor or external to the processor.

One or more of the components, steps, and/or functions illustrated in FIGS. 8, 16, 24 and 25 may be rearranged and/or combined into a single component, step, or function or embodied in several components, steps, or functions. Additional elements, components, steps, and/or functions may also be added without departing from the scope. The apparatus, devices, and/or components illustrated in FIGS. 8, 16 and/or 24 may be configured to perform one or more of the methods, features, or steps described above. The novel algorithms described herein may be efficiently implemented in software and/or embedded hardware.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the application described herein can be implemented in different systems without departing from the scope. For example, some implementations of the applications may be performed on computers, personal assistant devices, digital organizers, etc.

It should be noted that the foregoing embodiments are merely examples and are not to be construed as limiting the scope. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A method of encoding data using a low density parity check (LDPC) code capable of representation by a bipartite graph, the method comprising:
   generating an accumulate chain of a plurality of low degree variable nodes; and
   closing the accumulate chain to form a loop twice, once using a low degree variable node and once using a higher degree variable node which is higher than the low degree variable node, where the higher degree variable node comprises a non-loop-closing edge.

2. The method of claim 1, wherein the plurality of low degree variable nodes have the same permutation on each edge.

3. The method of claim 1, wherein,
   the plurality of low degree variable nodes comprise a plurality of core degree two variable nodes;
   the higher degree variable node comprises a core degree three variable node; and
   the loop-closing low degree variable node comprises a loop-closing core degree two variable node.

4. The method of claim 3, wherein the loop-closing core degree two variable node has permutations X and X+C−1 modulo Z, wherein C is a n−3 0 bit number, where n is a number of bits and X, C and Z are integers.

5. The method of claim 4, wherein C is 0.

6. The method of claim 1, further comprising using a lifted graph comprising a plurality of permuted copies of the accumulate chain; a plurality of permuted copies of the loop-closing low degree variable node and a plurality of permuted copies of the loop-closing higher degree variable node.

7. The method of claim 6, wherein the plurality of permuted copies of the loop-closing low degree variable nodes comprise a loop-closing low degree permutation by n−3 0-bit number A and A+C−1 mod $2^n$ where $2^n$ is a maximum lifting size and C is also a n−3 0 bit number, where n is a number of bits, and A and C are integers.

8. The method of claim 7, wherein a plurality of permuted non-loop-closing edges of the plurality of permuted copies of the loop-closing higher degree variable node comprise a non-loop-closing permutation by n−3 0-bit number B and B+C−1 mod $2^n$ where C is a n−3 0 bit number, and in a base graph, the B+C−1 permutation is associated with an edge connected to a same constraint node as the edge on the loop closing low degree variable node that has a permutation by number A, where B is an integer.

9. The method of claim 8, further comprising using a cyclic lifted low density parity check (LDPC) code in which for some base variable nodes, half of the lifted variable nodes are information nodes and half are parity nodes.

10. The method of claim 9, wherein a base graph structure of the LDPC code has a base encoding structure A with an additional degree two variable node, the additional degree two variable node comprising a loop-closing degree two variable node that closes the loop of the accumulate chain of structure A.

11. The method of claim 10, wherein all lifted nodes besides the lifted loop-closing degree two variable nodes are either parity or information nodes responsive to their respective base nodes.

12. The method of claim 10, wherein the constraint node attaching to the loop-closing degree two variable node on the edge with permutation X connects to the higher degree variable node with permutation Y+C−1, where X, Y and C are integers.

13. The method of claim 10, wherein when the base graph structure is expanded by a factor of two and the lifting size is decreased by a factor of two by moving a bit from the lifting into the base graph then the resulting encoding structure is lifted encoding structure A, with identify or without identity.

14. The method of claim 1, wherein a permutation on the non-loop-closing edge of the higher degree variable node is zero.

15. The method of claim 1, wherein a loop-closing edge of the higher degree variable node has associated lifting permutations Y and Y+C−1 modulo Z, where Y, C and Z are integers.

16. The method claim 1, wherein the
using a non-loop-closing edge permutation on a non-loop-closing edge of a core degree three encoding node, wherein the non-loop-closing edge permutation is zero; and
using for all other permutations, on the edges of core degree two variable nodes participating in the loop, the values zero or negative one mod 2.

17. An apparatus for encoding data using a low density parity check (LDPC) code capable of representation by a bipartite graph, the device comprising:
a memory device for storing the encoded data;
a control module;
a processing circuit coupled between the memory device and the control module, the processing circuit configured to:
generate an accumulate chain of a plurality of low degree variable nodes; and
close the accumulate chain to form a loop twice, once using a low degree
variable nodes and once using a higher degree variable node which is higher than the low degree variable node, where the higher degree variable node comprises a non-loop-closing edge.

18. The apparatus of claim 17, wherein the plurality of low degree variable nodes have the same permutation on each edge.

19. The apparatus of claim 17, wherein,
the plurality of low degree variable nodes comprise a plurality of core degree two variable nodes;
the higher degree variable node comprises a core degree three variable node; and the loop-closing low degree variable node comprises a loop-closing core degree two variable node.

20. The apparatus of claim 17, wherein the processing circuit is further configured to use a lifted graph comprising a plurality of permuted copies of the accumulate chain, a plurality of permuted copies of the loop-closing low degree variable node and a plurality of permuted copies of the loop-closing higher degree variable node.

21. The apparatus of claim 20, wherein the plurality of permuted copies of the loop-closing low degree variable nodes comprise a loop-closing low degree permutation by n−3 0-bit number A and A+C−1 mod $2^n$ where $2^n$ is a maximum lifting size and C is also a n−3 0 bit number, where n is a number of bits, and A and C are integers.

22. The apparatus of claim 21, wherein a plurality of permuted non-loop-closing edges of the plurality of permuted copies of the loop-closing higher degree variable node comprise a non-loop-closing permutation by n−3 0-bit number B and B+C−1 mod $2^n$ where C is a n−3 0 bit number, and in a base graph, the B+C−1 permutation is associated with an edge connected to a same constraint node as the edge on the loop closing low degree variable node that has a permutation by number A, where B is an integer.

23. The apparatus of claim 17, wherein the processing circuit is further configured to use a cyclic lifted low density parity check (LDPC) code in which for some base variable nodes, half of the lifted variable nodes are information nodes and half are parity nodes.

24. The apparatus of claim 23, wherein a base graph structure of the LDPC code has a base encoding structure A with an additional degree two variable node, the additional degree two variable node comprising a loop-closing degree two variable node that closes the loop of the accumulate chain of structure A.

25. The apparatus of claim 24, wherein all lifted nodes besides the lifted loop-closing degree two variable nodes are either parity or information nodes responsive to their respective base nodes.

26. An apparatus for encoding data using a low density parity check (LDPC) code capable of representation by a bipartite graph, the device comprising:
means for generating an accumulate chain of a plurality of low degree variable nodes; and
means for closing the accumulate chain to form a loop twice, once using a low degree variable nodes and once using a higher degree variable node which is higher than the low degree variable node, where the higher degree variable node comprises a non-loop-closing edge.

27. The apparatus of claim 26, wherein the plurality of low degree variable nodes have the same permutation on each edge.

28. The apparatus of claim 26, wherein
the plurality of low degree variable nodes comprise a plurality of core degree two variable nodes;
the higher degree variable node comprises a core degree three variable node; and the loop-closing low degree variable node comprises a loop-closing core degree two variable node.

29. The apparatus of claim 26, further comprising means for using a lifted graph comprising a plurality of permuted copies of the accumulate chain, a plurality of permuted copies of the loop-closing low degree variable node and a plurality of permuted copies of the loop-closing higher degree variable node.

30. The apparatus of claim 29, wherein the plurality of permuted copies of the loop-closing tow degree variable nodes comprise a loop-closing low degree permutation by n−3 0-bit number A and A+C−1 mod $2^n$ where $2^n$ is a maximum lifting size and C is also a n−3 0 bit number, where n is a number of bits, and A and C are integers.

31. The apparatus of claim 30, wherein a plurality of permuted non-loop-closing edges of the plurality of permuted copies of the loop-closing higher degree variable node comprise a non-loop-closing permutation by n−3 0-bit number B and B+C−1 mod $2^n$ where C is a n−3 0 bit number, and in a base graph, the B+C−1 permutation is associated with an edge connected to a same constraint node as the edge on the loop closing low degree variable node that has a permutation by number A, where B is an integer.

32. A processor readable medium having one or more instructions operational on an
encoder for achieving encoding data using a low density parity check (LDPC) code capable of representation by a bipartite graph, which when executed by a processor causes the processor to:
generate an accumulate chain of a plurality of low degree variable nodes; and close the accumulate chain to form a loop twice, once using a low degree variable nodes and once using a higher degree variable node which is higher than the low degree variable node, where the higher degree variable node comprises a non-loop-closing edge.

33. The processor readable medium of claim 32, wherein the plurality of low degree variable nodes have the same permutation on each edge.

34. The processor readable medium of claim 32, wherein:
the plurality of low degree variable nodes comprise a plurality of core degree two variable nodes;
the higher degree variable node comprises a core degree three variable node; and the loop-closing low degree variable node comprises a loop-closing core degree two variable node.

35. The processor readable medium of claim 32, further having one or more instructions which when executed by a processor causes the processor to:
use a lifted graph comprising a plurality of permuted copies of the accumulate chain, a plurality of permuted copies of the loop-closing low degree variable node and a plurality of permuted copies of the loop-closing higher degree variable node.

36. The processor readable medium of claim 35, wherein the plurality of permuted copies of the loop-closing low degree variable nodes comprise a loop-closing tow degree permutation by n−3 0-bit number A and B+C−1 mod $2^n$ where $2^n$ is a maximum lifting size and C is also a n−3 0 bit number, where n is a number of bits, and A and C are integers.

37. The processor readable medium 36, wherein a plurality of permuted non-loop closing edges of the plurality of permuted copies of the loop-closing higher degree variable node comprise a non-loop-closing permutation by n−3 0-bit number B and B+C−1 mod $2^n$ where C is a n−3 0 bit number, and in a base graph, the B+C−1 permutation is associated with an edge connected to a same constraint node as the edge on the loop closing low degree variable node that has a permutation by number A, where B is an integer.

38. A processor comprising:
a processing circuit configured to perform functions to achieve generating an accumulate chain of a plurality of low degree variable nodes; and
closing the accumulate chain to form a loop twice, once using a low degree variable nodes and once using a higher degree variable which is higher than the low degree variable node, where the higher degree variable node comprises a non-loop-closing edge.

39. The processor of claim 38, wherein the plurality of low degree variable nodes have the same permutation on each edge.

40. The processor of claim 38, wherein:
the plurality of low degree variable nodes comprise a plurality of core degree two variable nodes;
the higher degree variable node comprises a core degree three variable node; and the loop-closing low degree variable node comprises a loop-closing core degree two variable node.

41. The processor of claim 38, wherein the processing circuit is further configured to use a lifted graph comprising a plurality of permuted copies of the accumulate chain, a plurality of permuted copies of the loop-closing low degree variable node and a plurality of permuted copies of the loop-closing higher degree variable node.

* * * * *